(12) United States Patent
Shirai et al.

(10) Patent No.: US 7,226,866 B2
(45) Date of Patent: Jun. 5, 2007

(54) ETCHING METHOD FOR MAKING A RETICLE

(75) Inventors: Hisatsugu Shirai, Kawasaki (JP); Kiyoshi Ozawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 311 days.

(21) Appl. No.: 11/023,577

(22) Filed: Dec. 29, 2004

(65) Prior Publication Data
US 2005/0266318 A1 Dec. 1, 2005

(30) Foreign Application Priority Data
May 28, 2004 (JP) ............................. 2004-160135

(51) Int. Cl.
*H01L 21/302* (2006.01)
(52) U.S. Cl. ............... 438/704; 438/720; 438/725; 430/5
(58) Field of Classification Search ............... 438/694, 438/704, 706, 712, 719, 720, 723, 724, 725, 438/745; 430/5, 311
See application file for complete search history.

(56) References Cited

U.S. PATENT DOCUMENTS

| | | | | |
|---|---|---|---|---|
| 5,358,807 A | * | 10/1994 | Okamoto | 430/5 |
| 5,595,844 A | * | 1/1997 | Tomofuji et al. | 430/5 |
| 5,688,617 A | * | 11/1997 | Mikami et al. | 430/5 |
| 5,837,405 A | * | 11/1998 | Tomofuji et al. | 430/5 |
| 6,538,740 B1 | * | 3/2003 | Shiraishi et al. | 356/401 |
| 7,012,671 B2 | * | 3/2006 | Noguchi et al. | 355/53 |
| 2003/0027366 A1 | * | 2/2003 | Dulman et al. | 438/16 |

FOREIGN PATENT DOCUMENTS

| | | |
|---|---|---|
| JP | 01021450 A | 1/1989 |
| JP | 04085814 A | 3/1992 |

OTHER PUBLICATIONS

Iwasaki, H., et al., "Fabrication of the 70-nm line patterns with ArF chromeless phase-shift masks," Proceedings of SPIE, vol. 4754 (2002), pp. 384-395.

* cited by examiner

*Primary Examiner*—Kin-Chan Chen
(74) *Attorney, Agent, or Firm*—Westerman, Hattori, Daniels & Adrian, LLP.

(57) ABSTRACT

A reticle manufacturing method comprises a step of retreating side surfaces of a lift-off pattern to reduce an area of a wide pattern portion, a step of forming a wide convex pattern and a narrow convex pattern by etching a glass substrate (transparent substrate) while using a second mask pattern as a mask, a step of reducing an area of a first wide mask portion, a step of reducing at least an area of a second wide mask portion smaller than an area of the first wide mask portion, and a step of reducing an area of a wide light shielding portion by etching the wide light shielding portion while using the first wide mask portion as a mask.

19 Claims, 19 Drawing Sheets

FIG. 10

| | Prior Art | | Fifth Embodiment | |
|---|---|---|---|---|
| 1 | Cr light shielding layer2 + transparent substrate1 | | Cr light shielding layer 41 + transparent substrate | FIG.8A |
| 2 | | FIG.1A | forming the mask layer 42 | |
| 3 | coating the photoresist3 | | coating the photoresist 43 | |
| 4 | first lithography | | lithography | |
| 5 | developing | | developing | |
| 6 | | FIG.1B | etching the mask layer 42 | FIG.8B |
| 7 | etching the Cr light shielding layer2 | | etching the Cr light shielding layer 41 | |
| 8 | etching the transparent substrate1 | | etching the transparent substrate 40 | |
| 9 | removing the first resist pattern 3a, 3b | | | |
| 10 | cleaning | | | |
| 11 | inspection | FIG.1C | | |
| 12 | coating a photoresist | | | |
| 13 | second lithography* | | | |
| 14 | developing (formation of the second resist pattern) | | | |
| 15 | | | lifting-off the narrow resist portion 43b | FIG.8C |
| 16 | etching the wide Cr pattern 2a | FIG.1D | removing the resist pattern 43c | FIG.8D |
| 17 | removing the second resist pattern 4 | | etching the wide light shielding portion 41a | |
| 18 | | | etching the wide mask portion 42a | |
| 19 | | | | |
| 20 | cleaning | | cleaning | |
| 21 | inspection | | inspection | |
| 22 | pellicle | | pellicle | |
| 23 | inspection | | inspection | |

* additional step is required for preparing the exposure date for the second lithography as well as alignment ☐ : common steps
☐ : added steps
☐ : unneccesory steps for the fifth embodiment

ETCHING METHOD FOR MAKING A RETICLE

CROSS-REFERENCE TO RELATED APPLICATIONS

This application is based on and claims priority of Japanese Patent Application No. 2004-160135 filed on May 28, 2004, the entire contents of which are incorporated herein by reference.

BACKGROUND OF THE INVENTION

1. Field of the Invention

The present invention relates to a reticle manufacturing method.

2. Description of the Related Art

With the progress of fine patterns on account of the higher integration of the semiconductor device such as LSI, the super-resolution exposure technology such as the phase shift method is demanded. There are various phase shift methods. Out of them, the exposure method using a chromeless reticle can form the finest pattern. For this reason, such exposure method is expected to contribute largely to the miniaturization of the semiconductor devices. However, since the method of manufacturing the chromeless reticle becomes recently extremely complicated, the above exposure method using the chromeless reticle makes worse the productivity of the semiconductor device and cannot meet the demand for the mass production of the semiconductor device.

Subsequently, a chromeless reticle manufacturing method in the prior art will be explained with reference to FIGS. 1A to 1E hereunder.

FIGS. 1A to 1E are sectional views showing a chromeless reticle manufacturing method in the prior art in order of steps.

At first, as shown in FIG. 1A, a light shielding layer 2 made of chromium and a resist 3 are formed sequentially on a quartz substrate 1.

Then, steps required for obtaining the sectional structure showing in FIG. 1B will be explained hereunder.

First, a first resist pattern 3c having a wide resist portion 3a and a narrow resist portion 3b is formed by exposing the resist 3 by means of the electron beam (EB) exposure machine and then developing the resist 3. The Cr (chromium) light shielding layer 2 and the glass substrate 1 are then etched by using the first resist pattern 3c as a mask. Thus, the light shielding layer 2 is patterned to form a wide light shielding portion 2a and a narrow light shielding portion 2b. Moreover, the portion of the quartz substrate 1, where the portions 2a and 2b does not cover, is thinned by the etching and thus a thin thickness portion 1c is formed. A wide convex pattern 1a and a narrow convex pattern 1b, each having original thickness of the substrate 1 without being subjected to the etching, are formed under the portions 2a and 2b, An etching depth of the thin thickness portion 1c is determined according to a wavelength of an exposure light that is applied to the completed chromeless reticle. The etching depth is set to such a thickness that a phase of the light passed through the thin thickness portion 1c is sifted by just π from the phase of the light passed through the convex patterns 1a, 1b.

After the etching, the first resist pattern 3c is removed.

Then, as shown in FIG. 1C, the resist is coated on the overall surface and then exposed/developed by the electron beam exposure machine. Thus, a second resist pattern 4 having a planar shape that is smaller than the wide light shielding portion 2a is selectively formed only on the wide light shielding portion 2a.

Then, as shown in FIG. 1D, the light shielding portions 2a, 2b are etched by using the second resist pattern 4 as a mask. Thus, side surfaces of the wide light shielding portion 2a retreats, and thus an upper surface of the wide convex pattern 1a is exposed by an amount of such retreat. Also, the narrow light shielding portion 2b on the narrow convex pattern 1b is removed.

After that, as shown in FIG. 1E, a basic structure of the chromeless reticle in the prior art is completed by removing the second resist pattern 4.

FIG. 2 is a view showing a sectional shape of the chromeless reticle in the prior art together with a graph showing an intensity of the exposure light on the wafer.

As shown in FIG. 2, the chromeless reticle has a large width area A in which the wide light shielding portion 2a remains for exposing a wide pattern onto the wafer, and a small width area B in which the chromium pattern is removed for exposing a finer pattern than the large width area A.

In the small width area B, phases of the lights, each passed through the narrow convex pattern 1b and the thin thickness portion 1c, are shifted by π. Therefore, both lights interfere and cancel each other at the bottom of the side surface (edge) of the narrow convex pattern 1b. As a result, an intensity of the exposure light is sharply changed at the bottom of the edge and thus a fine and sharp pattern can be obtained on the wafer. The phenomenon that the intensity of the light is emphasized at the edge portion in this manner is also called the edge contrast effect.

According to this edge contrast effect, as disclosed in FIGS. 2a) to b) in Non-Patent Literature 1, the exposure light is not canceled around the center of the pattern if the width of the convex pattern is excessively wide, and therefore a desired dark pattern cannot be formed. As such, the width of the narrow convex pattern 1b must be reduced narrower than a certain upper limit value to achieve the edge contrast effect. This upper limit value is referred to as $C_{max}$ in the following. In the example shown in FIG. 2, the width of the narrow convex pattern 1b is set just to this $C_{max}$. According to this, the edge contrast can be obtained only for the region that goes inward by $C_{max}/2$ from the edge of the pattern.

In contrast, in the large width area A in FIG. 2, the upper surface of the wide convex pattern 1a is exposed by retreating the side surfaces of the wide light shielding portion 2a from the side surfaces of the wide convex pattern 1a, while leaving partially the wide light shielding portion 2a. As a result, most of the exposure light is shielded by the wide light shielding portion 2a and also the contrast of the pattern on the wafer is improved by the edge contrast effect.

The technology relevant to the present invention is disclosed on Patent Literatures 1, 2.

[Patent Literature 1] Patent Application Publication (KOKAI) Sho 64-21450

[Patent Literature 2] Patent Application Publication (KOKAI) Hei 4-85814

[Non-Patent Literature 1] H. Iwasaki, et al., "Fabrication of the 70-nm line patterns with ArF chromeless phase-shift masks", SPIE, vol. 4754

Meanwhile, an amount of retreat of the wide light shielding portion 2a in the large width area A must be set smaller than $C_{max}/2$ to achieve the edge contrast effect. However, if the amount of such retreat is set excessively small, intensity of exposure light passing through the wide convex pattern 1a is reduced and thus the exposure light passed through the wide convex pattern 1a cannot uniformly interfere with the exposure light passed through the thin thickness portion 1c, which in turn makes the edge of the pattern dim and lowers the pattern contrast.

For this reason, in the chromeless reticle of this type, the brightness contrast of the exposure light passed through the reticle must be set equal under the both edges by retreating the both edges of the wide light shielding portion 2a from the side surfaces of the wide convex pattern 1a by the same distance.

However, in the above chromeless reticle manufacturing method in the prior art, the second resist pattern 4 for forming the wide light shielding portion 2a must be formed apart from the first resist pattern 3c for forming the wide convex pattern 1a. Therefore, an alignment between the wide convex pattern 1a and the second resist pattern 4 must be performed precisely.

If this alignment is imprecise, the center of the wide light shielding portion 2a is displaced from the center of the wide convex pattern 1a, as shown in FIG. 3, and a intensity of exposure light becomes different at both edges of the wide light shielding portion 2a and thus the brightness contrast becomes different at the bottoms of both edges.

However, according to the patterning performed by the electron beam exposure machine, an alignment precision between the wide convex pattern 1a and the second resist pattern 4 (a minimum value of the displacement between both centers of the wide convex pattern 1a and the second resist pattern 4) is 20 to 30 nm at best. Therefore, it is difficult to align the wide convex pattern 1a and the second resist pattern 4 with good precision and thus it is difficult to maintain the balance of the contrast between the exposure lights as described above. This problem appears not only in the electron beam exposure machine but also in the exposure machine such as the stepper, or the like.

In addition, if the resist patterns are formed twice in this manner, the exposure date must be prepared for each of the patterns, which in turn prolongs the manufacturing steps and raises cost, so the above method is unsuitable for the mass production.

SUMMARY OF THE INVENTION

According to one aspect of the present invention, there is provided a reticle manufacturing method that comprises a step of forming a light shielding layer, a first mask layer, a second mask layer, a lift-off layer, and a third mask layer in this order on a transparent substrate; a step of patterning the third mask layer to form a third mask pattern having a third wide mask portion and a third narrow mask portion; a step of etching the lift-off layer while using the third mask pattern as a mask, to form a lift-off pattern having a wide pattern portion and a narrow pattern portion under the third wide mask portion and the third narrow mask portion respectively; a step of etching the second mask layer while using the lift-off pattern as a mask, to form a second mask pattern having a second wide mask portion and a second narrow mask portion under the wide pattern portion and the narrow pattern portion respectively; a step of retreating side surfaces of the lift-off pattern, to remove the narrow pattern portion and thus lift off the third narrow mask portion on the narrow pattern portion and to reduce an area of the wide pattern portion; a step of etching the first mask layer while using the second mask pattern as a mask, to form a first mask pattern having a first wide mask portion and a first narrow mask portion under the second wide mask portion and the second narrow mask portion respectively; a step of etching the light shielding layer while using the first mask pattern as a mask, to form a light shielding pattern having a wide light shielding portion and a narrow light shielding portion under the first wide mask portion and the first narrow mask portion respectively; a step of etching the transparent substrate while using the light shielding mask pattern as a mask, to reduce a thickness of a portion of the transparent substrate not covered with the second mask pattern and to make portions of the transparent substrate not etched and left under the second wide mask portion and the first narrow mask portion into a wide convex pattern and a narrow convex pattern respectively; a step of removing the third mask pattern; a step of retreating side surfaces of the first mask pattern to reduce an area of the first wide mask portion; a step of etching the second mask pattern to reduce at least an area of the second wide mask portion smaller than an area of the first wide mask portion; a step of etching the wide light shielding portion while using the first wide mask portion as a mask to reduce an area of the wide light shielding portion; and a step of removing the narrow light shielding portion.

According to this, the side surfaces of the first mask pattern are retreated and then the wide light shielding portion is patterned by using the first wide mask portion constituting this first mask pattern as a mask. Thus, an area of the wide light shielding portion is reduced and also the side surfaces of the wide light shielding portion are caused to retreat from the side surface of the wide convex pattern. Therefore, an amount of retreat of the wide light shielding portion becomes substantially equal to an amount of retreat of the first wide mask portion.

Therefore, because an amount of above retreat is set equal on all side surfaces of the first wide mask portion by employing the isotropic etching, or the like, a center of the wide light shielding portion that is patterned by using this first wide mask portion as a mask is also aligned with a center of the wide convex pattern in a self-align manner. Thus, all side surfaces of the wide light shielding portion are retreated from the wide convex pattern by the same amount of retreat. As a result, the brightness of the exposure light passed through this reticle can be made equal at the bottoms of all side surfaces of the wide light shielding portion.

In addition, in the present invention, the resist must be formed once only when the third mask layer is patterned. Therefore, a quantity of exposure data about the resist pattern formation can be reduced rather than the case where the resist should be formed twice like the prior art, and also a production cost can be reduced because the step of preparing the exposure data can be omitted.

Also, according to another aspect of the present invention, there is provided a reticle manufacturing method that comprises a step of forming a light shielding layer, a lift-off layer, a mask layer, and a resist in this order on a transparent substrate; a step of exposing and developing the resist to form a resist pattern having a wide resist portion and a narrow resist portion a step of etching the mask layer while using the resist pattern as a mask to form a mask pattern having a wide mask portion and a narrow mask portion under the wide resist portion and the narrow resist portion respectively; a step of etching the lift-off layer while using the mask pattern as a mask, to form a lift-off pattern having a wide pattern portion and a narrow pattern portion under the wide mask portion and the narrow mask portion respectively; a step of etching the light shielding layer while using the lift-off pattern as a mask, to form a light shielding mask pattern having a wide light shielding portion and a narrow light shielding portion under the wide pattern portion and the narrow pattern portion respectively; a step of retreating side surfaces of the light shielding pattern; a step of etching the transparent substrate while using the light shielding pattern as a mask, to reduce a thickness of a portion of the transparent substrate not covered with the mask pattern and to make portions of the transparent substrate not etched and left under the wide mask portion and the narrow mask portion into a wide convex pattern and a narrow convex pattern respectively; a step of retreating side surfaces of the lift-off pattern to remove the narrow pattern portion and thus lift off the narrow mask portion on the narrow pattern portion; and a step of removing the narrow light shielding portion.

According to the present invention, an amount of retreat in the step of retreating the side surfaces of the light shielding pattern becomes equal to a final amount of retreat of the wide light shielding portion. Therefore, because the side surfaces of the light shielding pattern are retreated by the isotropic etching, or the like, all side surfaces of the wide light shielding portion are retreated from the wide convex pattern by the same amount, so that a center of the wide light shielding portion is aligned precisely with a center of the wide convex pattern in a self-align manner. As a result, the brightness of the exposure light passed through this reticle can be made equal at the bottoms of all side surfaces of the wide light shielding portion.

In addition, in the present invention, the resist must be formed once only when the mask layer is patterned. Therefore, a quantity of exposure data about the resist pattern formation can be reduced rather than the case where the resist should be formed twice like the prior art, and also a production cost can be reduced because the step of preparing the exposure data can be omitted.

Then, in the present invention, only one layer of the mask layer is formed and then the lift-off layer and the convex patterns are patterned by using this mask layer respectively. As a result, the number of steps can be reduced in contrast to the case where the dedicated mask layer are prepared for the lift-off layer and the convex patterns respectively, and thus improvement in a cost reduction and productivity can be attained.

Also, according to still another aspect of the present invention, there is provided a reticle manufacturing method that comprises a step of forming a light shielding layer, a mask layer, a lift-off layer, and a resist in this order on a transparent substrate; a step of exposing and developing the resist) to form a resist pattern having a wide resist portion and a narrow resist portion; a step of etching the lift-off layer while using the resist pattern as a mask, to form a lift-off pattern having a wide pattern portion and a narrow pattern portion under the wide resist portion and the narrow resist portion respectively; a step of etching the mask layer while using the lift-off pattern as a mask, to form a mask pattern having a wide mask portion and a narrow mask portion under the wide pattern portion and the narrow pattern portion respectively; a step of etching the light shielding layer while using the mask pattern as a mask, to form a light shielding pattern having a wide light shielding portion and a narrow light shielding portion under the wide mask portion and the narrow mask portion respectively; a step of retreating side surfaces of the mask pattern; a step of retreating side surfaces of the lift-off pattern, to remove the narrow pattern portion and thus lift off the narrow mask portion and the narrow resist portion on the narrow pattern portion; a step of etching the transparent substrate while using the light shielding pattern as a mask, to reduce a thickness of a portion of the transparent substrate not covered with the light shielding pattern and to make portions of the transparent substrate not etched and left under the wide light shielding portion and the narrow light shielding portion into a wide convex pattern and a narrow convex pattern respectively; a step of removing the narrow mask portion; a step of removing the wide resist portion; and a step of etching the light shielding pattern while using the wide mask portion as a mask, to reduce an area of the wide light shielding portion and to remove the narrow light shielding portion.

According to the present invention, an amount of retreat in the step of retreating the side surfaces of the mask pattern is equal to an amount of retreat of the wide light shielding portion from the side surface of the wide convex pattern. Therefore, if the side surfaces of the mask pattern are retreated by the isotropic etching, or the like, all side surfaces of the wide light shielding portion are retreated from the wide convex pattern by the same amount, so that a center of the wide light shielding portion is aligned precisely with a center of the wide convex pattern in a self-align manner. As a result, the brightness of the exposure light passed through this reticle can be made equal at the bottoms of all side surfaces of the wide light shielding portion.

In addition, because the resist should be formed only once in the present invention, a production cost can be reduced.

Further, in the present invention, the light shielding pattern is also used as the masks for the wide convex pattern and the narrow convex patterns. Therefore, the number of steps can be reduced rather than the case where the masks exclusively used for respective convex patterns are formed, and thus improvement in the cost reduction and the productivity can be attained.

Also, according to yet still another aspect of the present invention, there is provided a reticle manufacturing method that comprises a step of forming a light shielding layer, a mask layer, a lift-off layer, and a resist in this order on a transparent substrate; a step of exposing and developing the resist to form a resist pattern having a wide resist portion and a narrow resist portion; a step of etching the lift-off layer while using the resist pattern as a mask, to form a lift-off pattern having a wide pattern portion and a narrow pattern portion under the wide resist portion and the narrow resist portion respectively; a step of etching the mask layer while using the lift-off pattern as a mask, to form a mask pattern having a wide mask portion and a narrow mask portion under the wide pattern portion and the narrow pattern portion respectively; a step of retreating side surfaces of the lift-off pattern, to reduce an area of the wide pattern portion and to remove the narrow pattern portion and thus lift off the resist pattern; a step of etching the light shielding layer while using the mask pattern as a mask, to form a light shielding pattern having a wide light shielding portion and a narrow light shielding portion under the wide mask portion and the narrow mask portion respectively; a step of etching the transparent substrate while using the light shielding pattern as a mask, to reduce a thickness of a portion of the transparent substrate not covered with the light shielding pattern and to make portions of the transparent substrate not etched and left under the wide light shielding portion and the narrow light shielding portion into a wide convex pattern and a narrow convex pattern respectively; a step of etching the mask pattern while using the wide pattern portion in the lift-off pattern as a mask after the lift-off, to reduce an area of the wide mask portion and to remove the narrow mask portion; and a step of etching the light shielding pattern while using the wide mask portion as a mask after the area of the wide mask portion is reduced, to reduce an area of the wide light shielding portion and to remove the narrow light shielding portion.

According to the present invention, an amount of retreat in the step of retreating the side surfaces of the lift-off pattern is equal to an amount of retreat of the wide light shielding portion from the side surface of the wide convex pattern. Therefore, if the side surfaces of the lift-off pattern are retreated by employing the isotropic etching, or the like, the wide light shielding portion is retreated from all side surfaces of the wide convex pattern by the same amount of retreat. As a result, the brightness of the exposure light passed through this reticle can be made equal at the bottoms of all side surfaces of the wide light shielding portion.

Also, in the present invention, the resist should be formed only once. Therefore, a quantity of exposure data about the resist pattern formation can be reduced rather than the prior art, and also a production cost can be reduced.

In addition, in the present invention, a sheet of lift-off pattern can be used not only to decide the width of the wide light shielding portion by the patterning but also to lift off the resist pattern. Therefore, the number of steps can be reduced rather than the case where individual masks for the purpose of patterning the wide light shielding portion and lifting off the resist pattern are formed respectively, and thus improvement in the cost reduction and the productivity can be brought about.

Also, according to further aspect of the present invention, there is provided a reticle manufacturing method that comprises a step of forming a light shielding layer, a lift-off layer, and a resist in this order on a transparent substrate; a step of exposing and developing the resist to form a resist pattern having a wide resist portion and a narrow resist portion; a step of etching the lift-off layer while using the resist pattern as a mask, to form a lift-off pattern having a wide pattern portion and a narrow pattern portion under the wide resist portion and the narrow resist portion respectively; a step of etching the light shielding layer while using the lift-off pattern as a mask, to form a light shielding pattern having a wide light shielding portion and a narrow light shielding portion under the wide pattern portion and the narrow pattern portion respectively; a step of etching the transparent substrate while using the light shielding pattern as a mask, to reduce a thickness of a portion of the transparent substrate not covered with the light shielding pattern and to make portions of the transparent substrate not etched and left under the wide light shielding portion and a narrow light shielding portion into a wide convex pattern and a narrow convex pattern respectively; a step of retreating side surfaces of the lift-off pattern, to reduce an area of the wide pattern portion and to remove the narrow pattern portion and thus lift off the narrow resist portion on the narrow pattern portion; a step of removing the wide resist portion; and a step of etching the light shielding pattern while using the wide pattern portion as a mask after the lift off, to reduce an area of the wide light shielding portion and to remove the narrow light shielding portion.

According to the present invention, the side surfaces of the wide pattern portion are retreated, and then an area of the wide light shielding portion is reduced by etching the light shielding pattern while using the wide pattern portion as a mask, and thus the side surfaces of the wide light shielding portion are retreated from the side surfaces of the wide convex pattern. Therefore, an amount of retreat of the wide pattern portion can be made substantially equal on all side surfaces by retreating the side surfaces of the wide pattern portion by means of the isotropic etching, or the like, and thus all side surfaces of the wide light shielding portion that is etched by using this wide pattern portion as a mask are also retreated from the side surfaces of the wide convex pattern by the same amount. As a result, because a center of the wide light shielding portion is aligned precisely with a center of the wide convex pattern in a self-align manner, the brightness of the exposure light passed through this reticle can be made uniform at the bottoms of all side surfaces of the wide light shielding portion.

Also, in the present invention, since the resist must be formed only once, a quantity of exposure data about the resist pattern formation can be reduced small rather than the prior art. Therefore, because the step of aligning the portions and the step of preparing exposure data about the secondary drawing can be neglected, a production cost can be reduced.

In addition, in the present invention, since the number of layers formed on the transparent substrate is only three, the number of steps can be reduced small and also the productivity can be improved.

BRIEF DESCRIPTION OF THE DRAWINGS

FIG. 10 is a table in which respective steps in the prior art and the fifth embodiment of the present invention are compared mutually.

DETAILED DESCRIPTION OF THE PREFERRED EMBODIMENTS

Preferred embodiments for carrying out the present invention will be explained in detail with reference to the accompanying drawings hereinafter.

(1) First Embodiment

Figure 1A:
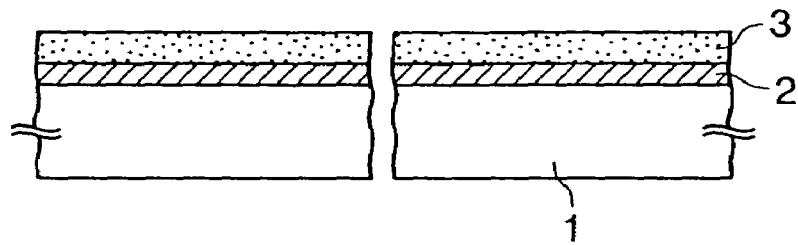
FIGS. 1A to 1E are sectional views showing a reticle manufacturing method in the prior art in order of steps.
Figure 1B:
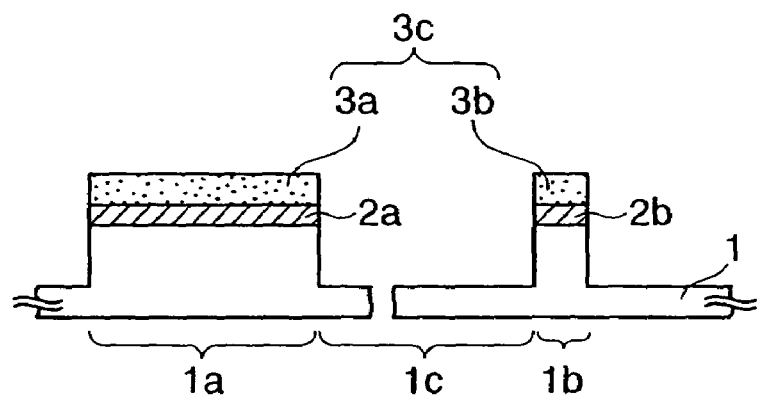
Figure 1C:
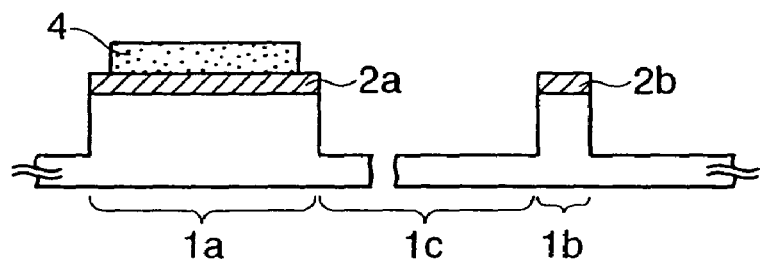
Figure 1D:
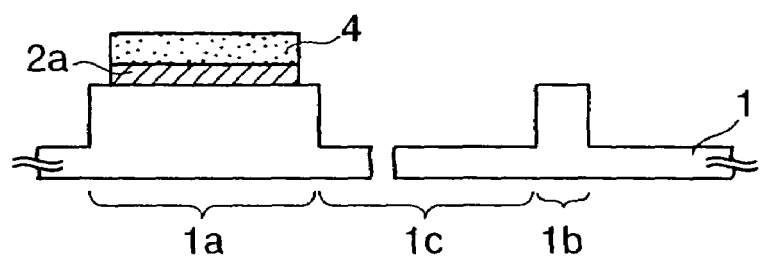
Figure 1E:
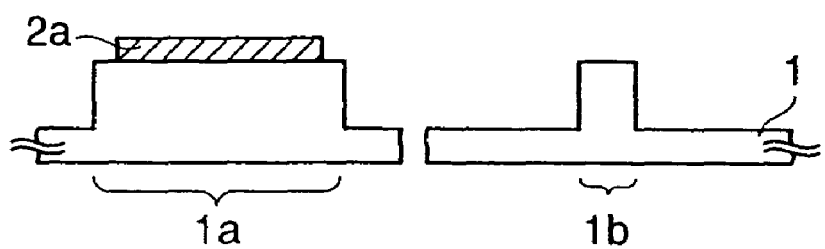
Figure 2:
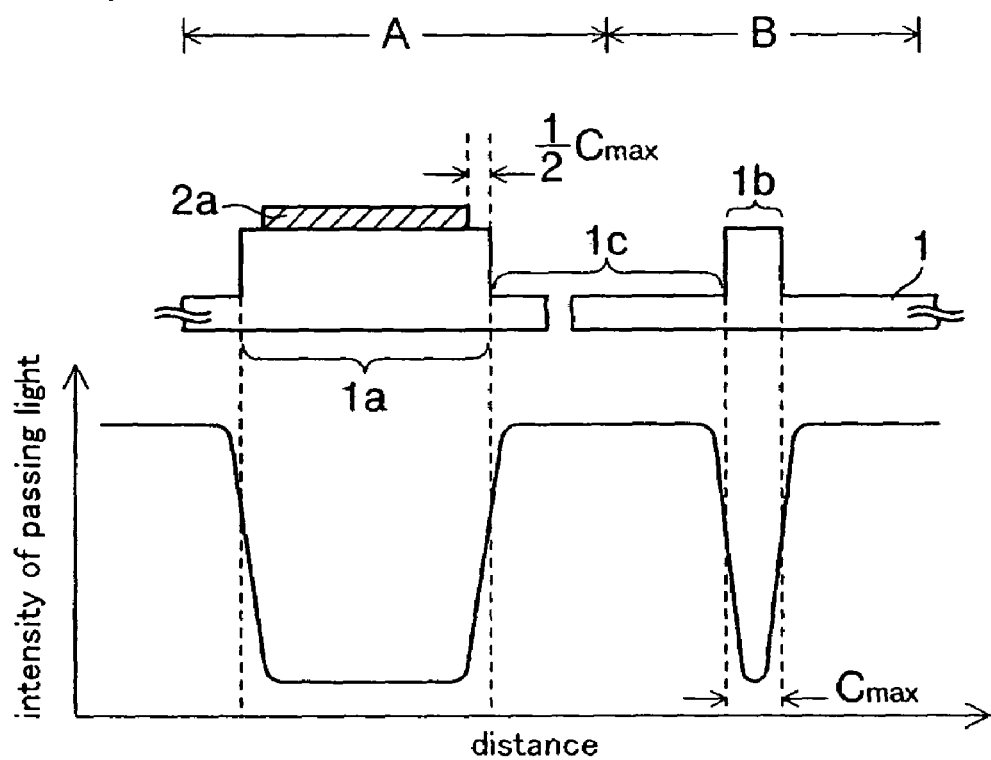
FIG. 2 is a view showing a sectional shape of a reticle in the prior art together with a graph showing an intensity of an exposure light on a wafer.
Figure 3:
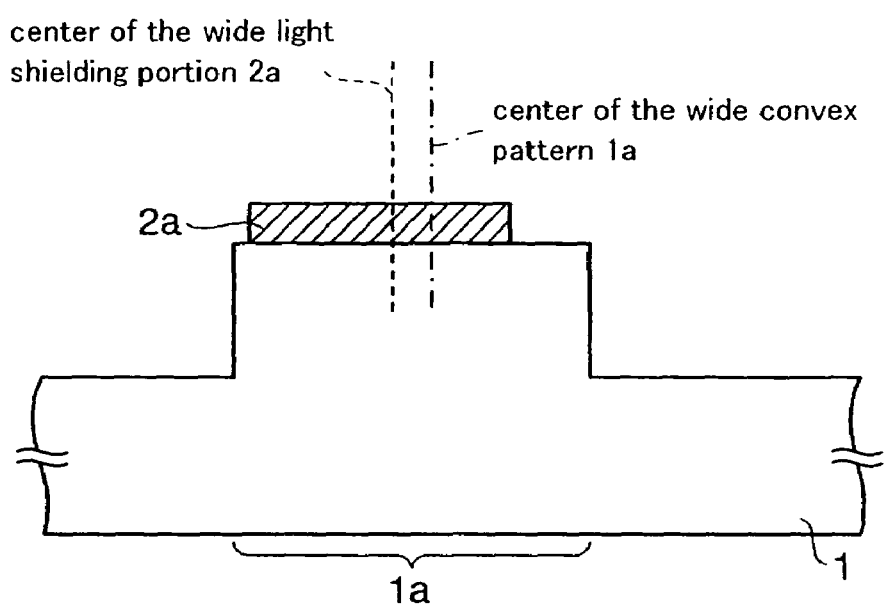
FIG. 3 is a sectional view illustrating the problem of the reticle in the prior art.
Figure 4A:
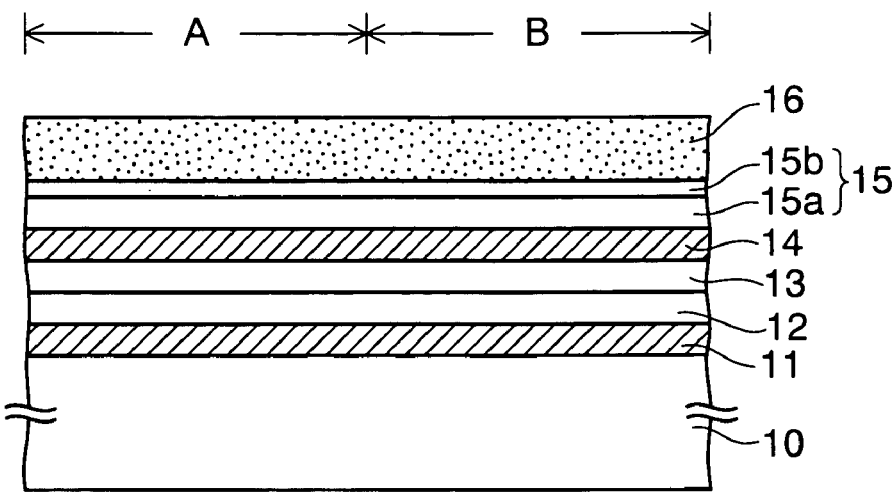
FIGS. 4A to 4N are sectional views showing a reticle manufacturing method according to a first embodiment of the present invention in order of steps.
Figure 4B:
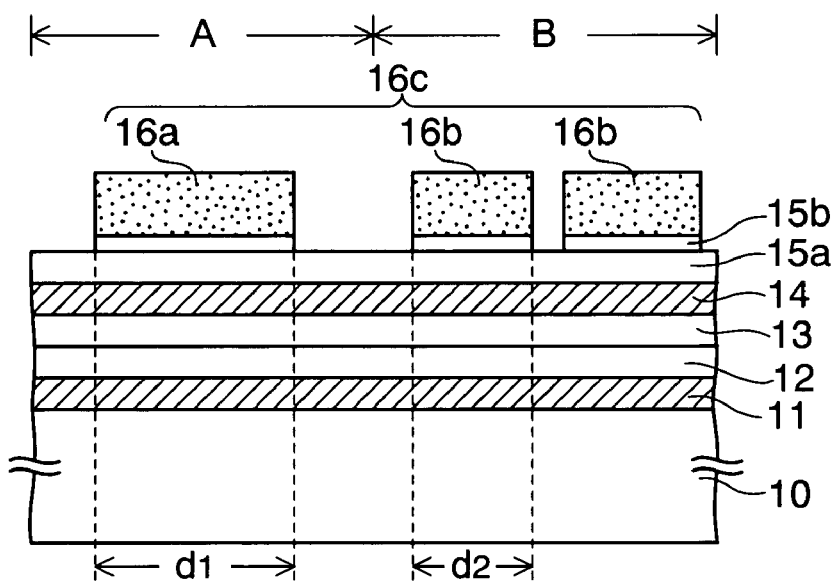
Figure 4C:
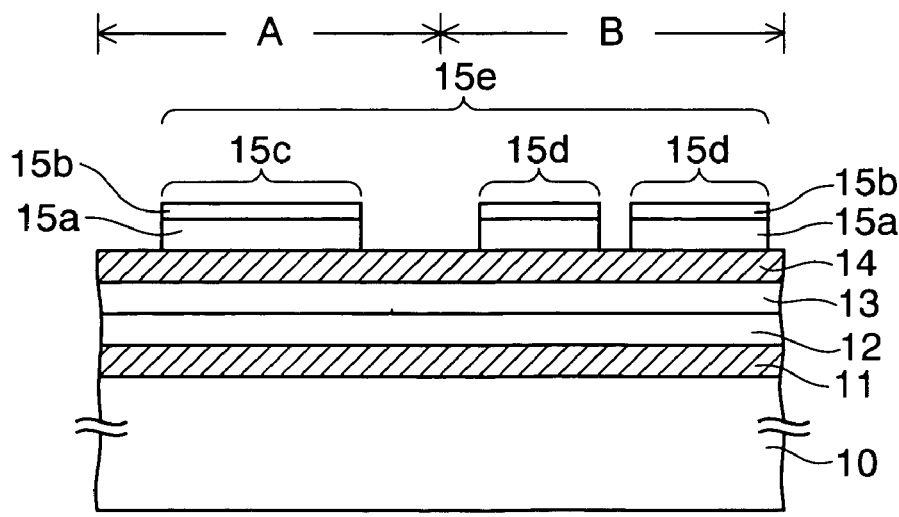
Figure 4D:
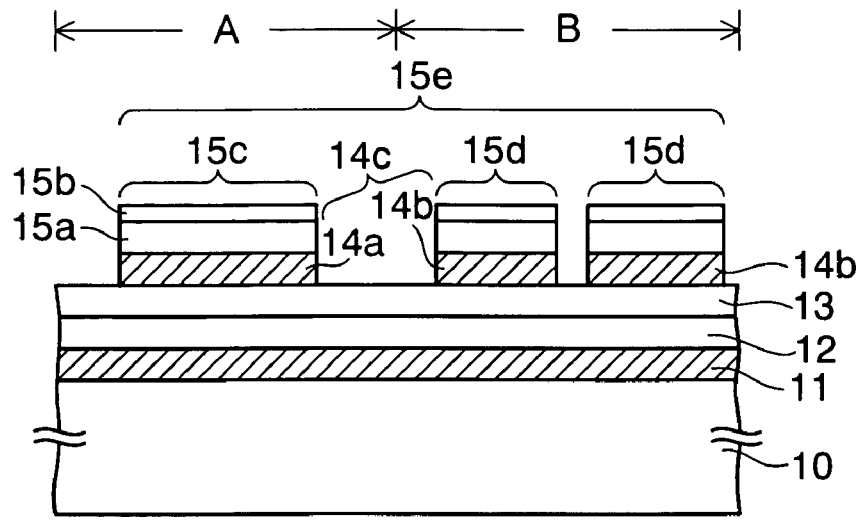
Figure 4E:
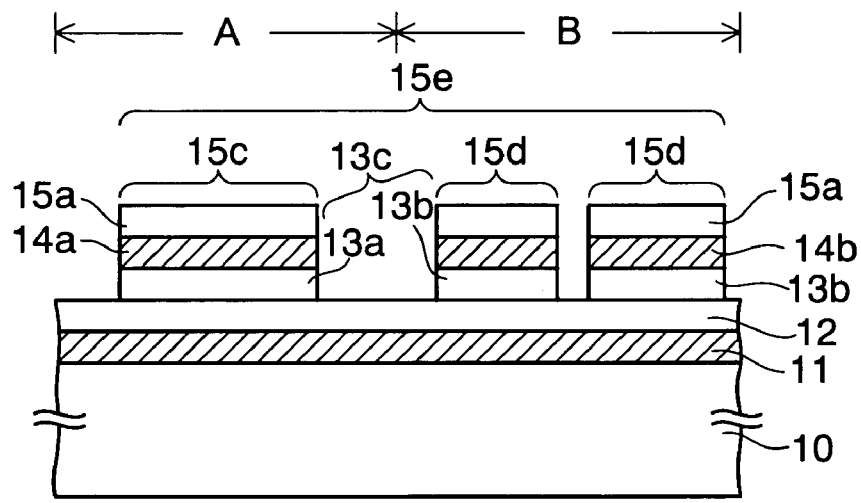
Figure 4F:
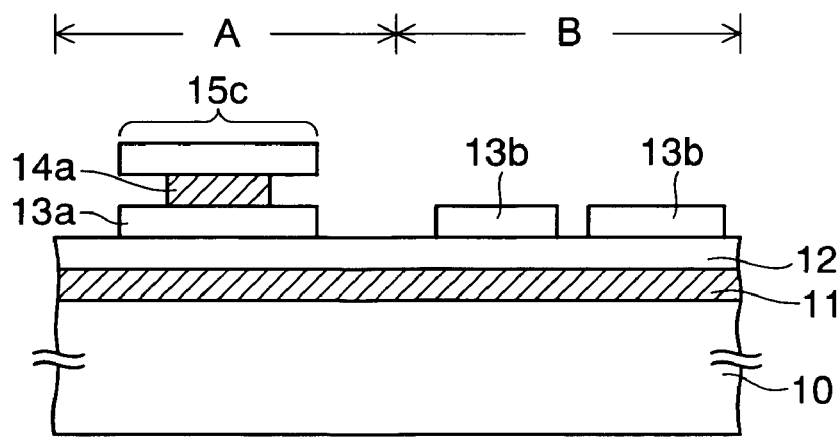
Figure 4G:
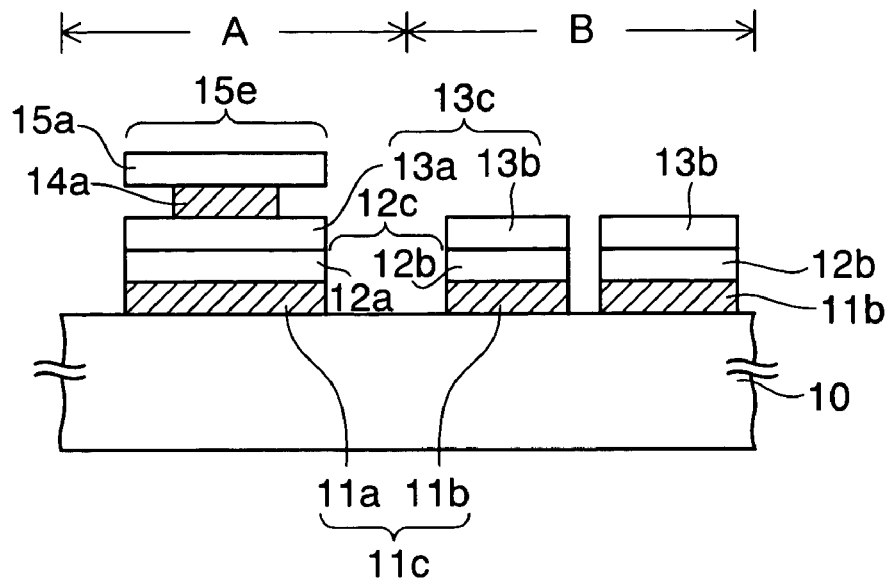
Figure 4H:
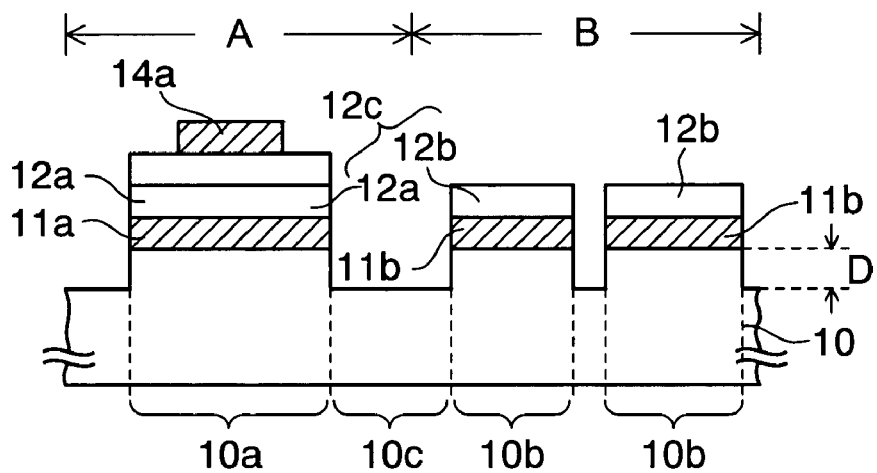
Figure 4I:
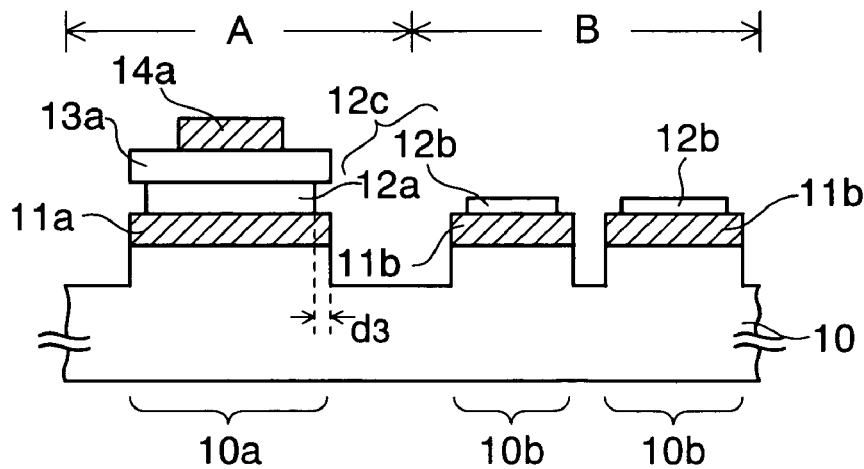
Figure 4J:
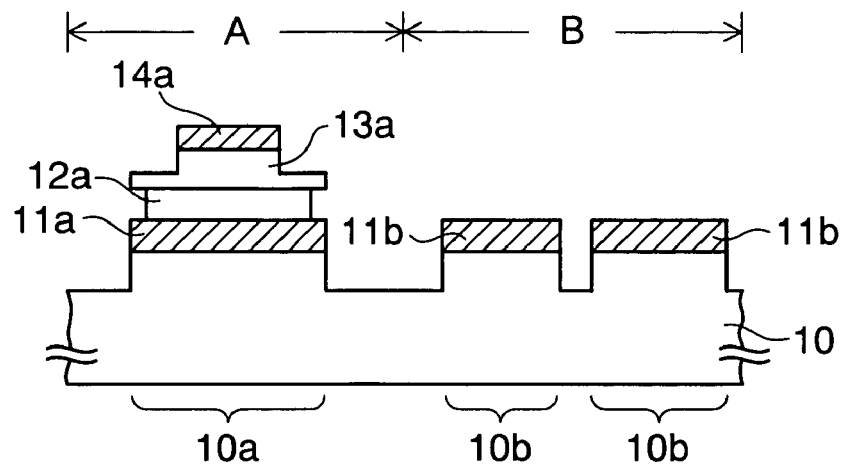
Figure 4K:
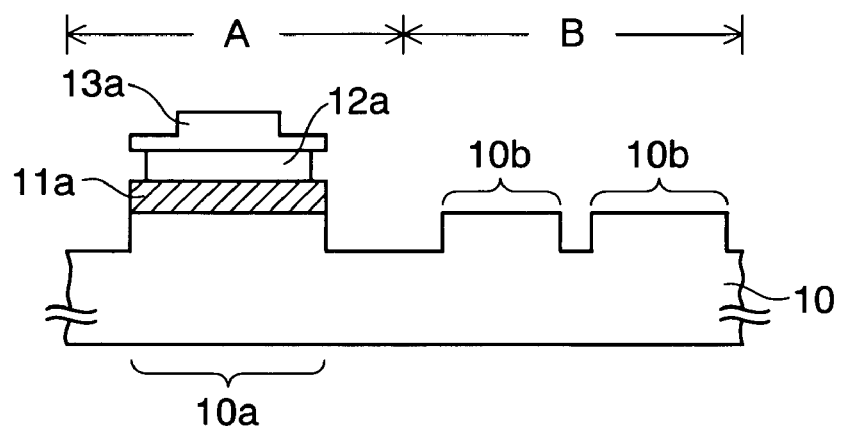
Figure 4L:
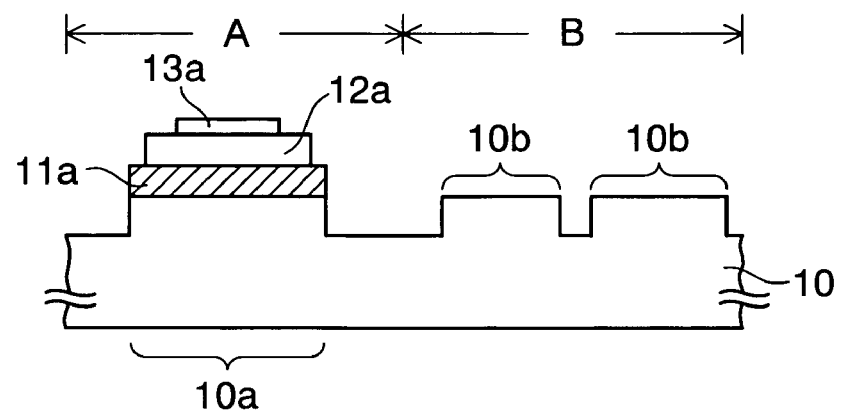
Figure 4M:
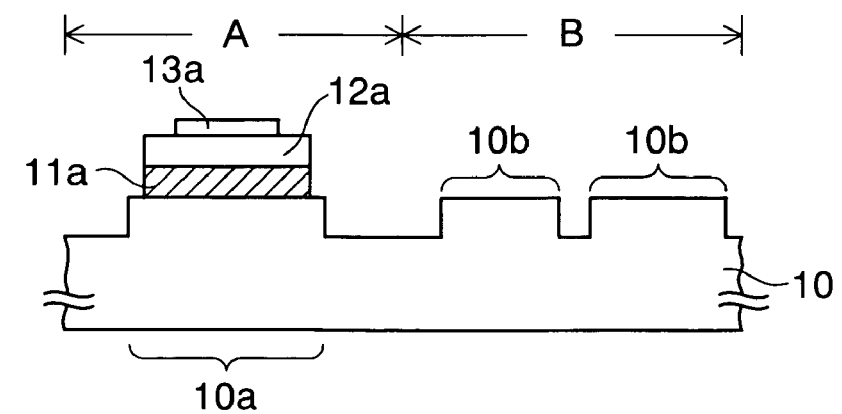
Figure 4N:
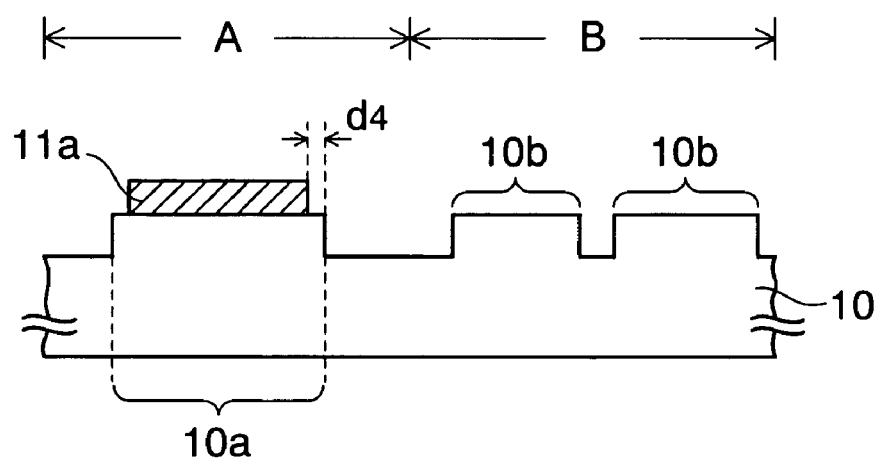

FIGS. 4A to 4N are sectional views showing a reticle manufacturing method according to a first embodiment of the present invention in order of steps.

At first, steps required until a sectional structure showing in FIG. 4A is obtained will be explained hereunder.

First, a Cr (chromium) layer of about 80 nm thickness is formed as a light shielding layer 11 on a glass substrate 10 by the sputter method. Then, a SiNx (silicon nitride) layer of 150 nm thickness is formed on the light shielding layer 11 by the plasma CVD using $SiH_4+NH_3+N_2$ as a reaction gas, while applying an RF power of 400 W, whose frequency is 13.56 MHz, to the reaction gas under conditions that a pressure is 600 Pa and a substrate temperature of 350° C. This layer is used as a first mask layer 12. As the layer constituting the first mask layer 12, there are a silicon dioxide layer, a silicon oxide nitride (SiON) layer, a silicon carbide (SiC) layer, a silicon oxycarbide (SiOC) layer, an amorphous silicon layer, and a silicon oxide fluoride (SiOF) layer, in addition to the silicon nitride layer.

Then, an $SiO_2$ (silicon dioxide) layer of 220 nm thickness is formed on the first mask layer 12 by using $SiH_4+N_2O+N_2$ as the reaction gas, while applying an RF power of 500 W, whose frequency is 13.56 MHz, to the reaction gas under conditions that a pressure is 600 Pa and a substrate temperature of 350° C. This layer is used as a second mask layer 13. Any one of the silicon nitride layer, the silicon oxide nitride (SiON) layer, the silicon carbide (SiC) layer, the silicon oxycarbide (SiOC) layer, the amorphous silicon layer, and the silicon oxide fluoride (SiOF) layer may be formed in place of the silicon dioxide layer.

Then, a Cr layer of about 120 nm thickness is formed as a lift-off layer 14 by the sputter method. The material constituting the lift-off layer 14 is not limited to Cr if metallic material may have a selective etching ratio to the underlying second mask layer 13, or the like. In this case, if Cr that is the same as the light shielding layer 11 is employed as the material, a film forming equipment exclusively used to form the lift-off layer 14 is not needed and the number of required film forming equipments can be reduced.

As the film that can be formed as the lift-off layer 14, any one of a metal layer such as an Al (aluminum) layer, an Mg (magnesium) layer, an In (indium) layer, an Sn (tin) layer, etc. and a metallic material layer such as a Cr alloy layer, a Cr oxide layer, a Cr nitride layer, an Al alloy layer, an Mg alloy layer, an In alloy layer, an In oxide layer, an Sn alloy layer, an Sn oxide layer, an In—Sn oxide layer, etc. may be employed in addition to the Cr layer.

In addition, the lift-off layer 14 may be formed of any one of the silicon dioxide layer, the silicon nitride layer, the silicon oxide nitride (SiON) layer, the silicon carbide (SiC) layer, the silicon oxycarbide (SiOC) layer, the amorphous silicon layer, and the silicon oxide fluoride (SiOF) layer.

Then, the Novorak resin is spin-coated on the lift-off layer 14, and then this Novorak resin is annealed under the conditions of a substrate temperature 250° C. and a process time 30 minute to cure. Thus, a resin layer 15a of about 300 nm thickness is formed.

Then, the organic siloxane polymer is spin-coated on the resin layer 15a, and then this organic siloxane polymer is annealed under the conditions of a substrate temperature 200° C. and a process time 30 minute to cure. Thus, a SOG (Spin On Glass) layer 15b of about 90 nm thickness is formed. This SOG layer 15b and the underlying resin layer 15a constitute a third mask layer 15.

Then, a resist such as a chemical amplification type negative resist, or the like is spin-coated on the third mask layer 15 and then this resist is prebaked under the conditions of a substrate temperature 90° C. and a process time 20 minute. Thus, a resist 16 of about 250 nm thickness is formed.

In this case, the resist 16 such as the ArF resist, or the like, which has a sensitivity to the ultraviolet rays of a short wavelength, has the low dry-etching resistance, the sectional shape is deformed by the subsequent etching step and a patterning precision of the underlying film is liable to lower. However, in the present embodiment, since the third mask layer 15 acting as a hard mask is formed under the resist 16 and this third mask layer 15 and the resist 16 are used as an etching mask described later, the patterning precision can be enhanced.

In this manner, the mask consisting of the resist 16 together with the third mask layer 15 is also called a trilevel resist.

Also, in order to prevent the adhesion of the dust on interfaces of respective layers and enhance the reproducibility of various properties of the layers, it is preferable that the subsequent layer should be formed by using the multi-chamber film forming equipment, or the like without exposure to an atmosphere after the preceding layer is formed.

Then, the transparent substrate 10 has a large width area A in which the light shielding pattern such as a wide chromium pattern, or the like is left finally, and a small width area B in which the light shielding pattern is not left but the light is shield by using a phase difference of the exposure light.

Then, steps required until a sectional structure showing in FIG. 4B is obtained will be explained hereunder.

First, the glass substrate 10 is loaded in the electron beam exposure machine (not shown), and then the resist 16 is exposed by the electron beam while employing the condition of an acceleration voltage 50 KV. This exposure condition is similar in second to fifth embodiments described later.

Then, the resist 16 is developed. Thus, a resist pattern 16c having a wide resist portion 16a formed in the large width area A and narrow resist portions 16b formed in the small width area B is formed.

Then, the SOG layer 15 is patterned by the anisotropic plasma etching using $CF_4+Ar$ as an etching gas at a pressure of 50 mTorr, while applying the RF power 500 W, whose frequency is 13.56 MHz, to the etching gas and using the resist pattern 16c as an etching mask. Then, the resist pattern 16c is removed by the ashing in the parallel-plate type etching machine in which the substrate temperature is kept at a room temperature, while employing the conditions of an oxygen gas flow rate 100 sccm, a pressure 20 Pa, and an RF power 300 W whose frequency is 13.56 MHz.

Then, as shown in FIG. 4C, the resin layer 15a is anisotropically etched, while using the SOG layer 15 patterned in this manner as an etching mask. In this etching, an $N_2+NH_3$ gas is used as the etching gas and also conditions of a pressure 100 mTorr and an RF power 300 W having a frequency 13.56 MHz are employed.

Thus, a third mask pattern 15e that is constructed by respective patterned layers 15a, 15b and has a third wide mask portion 15c and a third narrow mask portion 15d is formed.

Then, as shown in FIG. 4D, the lift-off layer made of Cr is etched by using $Cl_2+O_2$ as an etching gas under conditions of a pressure 20 Pa and an RF power 300 W having a frequency 13.56 MHz, while using the third mask pattern 15e as a mask. Thus, a lift-off pattern 14c having a wide pattern portion 14a and a narrow pattern portion 14b under the third wide mask portion 15c and the third narrow mask portion 15d respectively is formed.

Then, as shown in FIG. 4E, the second mask layer 13 made of silicon dioxide is anisotropically etched by using the lift-off pattern 14c as a mask. Thus, a second mask pattern 13c having a second wide mask portion 13a and a second narrow mask portion 13b under the wide pattern portion 14a and the narrow pattern portion 14b respectively is formed.

In this etching, a $C_4F_6+O_2+Ar$ gas is used as the etching gas and also conditions of a pressure 30 mTorr and an RF power 100 W having a frequency 13.56 MHz are employed.

In addition, the SOG layer 15b having the almost same etching rate as the second mask pattern 13c is removed by the etching, and only the resin layer 15a is left as the third mask pattern 15e.

Then, steps required until a sectional structure showing in FIG. 4F is obtained will be explained hereunder.

First, an etchant formed of a secondary cerium nitride ammon solution is produced and then the glass substrate 10 is dipped in the etchant. This etchant can selectively dissolve the chromium. Thus, side surfaces of the lift-off pattern 14c made of chromium are retreated, so that the narrow pattern portions 14b are removed to lift off the third narrow mask portion 15d and also an area of the wide pattern portion 14a is decreased.

Then, steps required until a sectional structure showing in FIG. 4G is obtained will be explained hereunder.

First, the first mask layer 12 made of silicon nitride is anisotropically etched by using $C_4F_8+CO+O_2+Ar$ as an etching gas at a pressure of 10 Pa, while applying the RF power 500 W, whose frequency is 13.56 MHz, to the etching gas and using the second mask pattern 13c as an etching mask. As a result, a first mask pattern 12c having a first wide mask portion 12a and a first narrow mask portion 12b under the second wide mask portion 13a and the second narrow mask portion 13b respectively.

Then, the light shielding layer 11 made of chromium is etched by using the first mask pattern 12c as a mask under the same conditions as those applied to etch the lift-off layer 14 shown in FIG. 4D. Thus, a light shielding pattern 11c having a wide light shielding portion 11a and a narrow light shielding portion 11b under the first wide mask portion 12a and the first narrow mask portion 12b respectively is formed.

Then, steps required until a sectional structure showing in FIG. 4H is obtained will be explained hereunder.

First, the glass substrate 10 is etched by using the light shielding mask pattern 11c as a mask. Thus, a portion of the transparent substrate 10 not covered with the light shielding mask pattern 11c is reduced in thickness, and also portions of the glass substrate 10, which are not etched and left under the wide light shielding mask portion 11a and the narrow light shielding mask portion 11b respectively, are shaped into a wide convex pattern 11a and a narrow convex pattern 10b. In this etching, the same conditions as the etching conditions for the second mask layer 13 shown in FIG. 4E and, for example, the $C_4F_6+O_2+Ar$ gas is used as the etching gas and also conditions of the pressure 30 mTorr and the RF power 100 W having the frequency 13.56 MHz are employed.

In addition, the second narrow mask portions 13b made of silicon dioxide are removed by this etching because such mask portions 13b has the almost same etching rate as the glass substrate 10. Thus, the third mask pattern 15e has been removed automatically at the end of this step.

Also, an etching depth D at this time is given as a depth at which a phase difference between the exposure lights passed through the narrow convex pattern 10b and a thin thickness portion 10c, which is thinned by the etching, respectively is just π. Suppose that an Ar light having a wavelength (λ) is 193 nm is used as the exposure light and a refractive index (n) of the glass substrate is 1.45, the etching depth D is given by 214 nm (=λ/2(n−1)). This is similarly true of the second to fifth embodiments described later.

Then, as shown in FIG. 4I, the glass substrate 10 is loaded into the barrel type reactor (not shown) and then the etching gas composed of $CF_4+O_2$ is introduced into the reactor. Then, the first mask pattern 12c made of silicon nitride is etched selectively and isotropically. As a result, side surfaces of the first mask patterns 12c retreat and an area of the first wide mask portion 12a is reduced.

Then, as shown in FIG. 4J, the first narrow mask portions 12b made of silicon nitride on the narrow light shielding portions 11b are removed by the etching. As the conditions in this etching, the same conditions as the etching conditions for the first mask layer 12 shown in FIG. 4G and, for example, the $C_4F_8+CO+O_2+Ar$ gas is used as the etching gas and also conditions of the RF power 100 W having the frequency 13.56 MHz and the pressure 10 Pa are employed.

Also, in this etching, the second wide mask portion 13a is etched by using the wide pattern portion 14a as a mask. Therefore, a portion of the second wide mask portion 13a not covered with the wide pattern portion 14a is reduced in thickness.

Then, as shown in FIG. 4K, the narrow light shielding portions 11b made of chromium on the narrow convex patterns 10b are removed by the anisotropic etching under the same conditions as the etching of the light shielding layer 11 explained in FIG. 4G, for example, the conditions that $Cl_2+O_2$ is used as the etching gas, the RF power whose frequency is 13.56 MHz is set to 300 W, and the pressure is set to 20 Pa.

Then, as shown in FIG. 4L, the second wide mask portion 13a made of silicon dioxide is wet-etched by dipping the glass substrate 10 into a hydrofluoric acid solution in which a ratio of $HF:H_2O$ is set to 1:200. Thus, at least an area of the second wide mask portion 13a is reduced smaller than an area of the first wide mask portion 12a.

Then, as shown in FIG. 4M, the anisotropic etching is applied to the wide light shielding portion 11a by using the first wide mask portion 12a as a mask. Thus, an area of the wide light shielding portion 11a is reduced. This anisotropic etching is executed under the same conditions as the etching of the lift-off layer 14 shown in FIG. 4D, for example, $Cl_2+O_2$ is used as the etching gas, the pressure is set to 20 Pa, and the RF power whose frequency is 13.56 MHz is set to 300 W.

Then, as shown in FIG. 4N, the first and second wide mask portion 12a, 13a on the wide light shielding portion 11a are removed.

With the above, a basic structure of the recticle according to the present embodiment is completed.

This recticle is the chromeless recticle. As shown in FIG. 4N, while leaving the wide light shielding portion 11a in the large width area A, the side surface of the wide light shielding portion 11a is retreated from the side surface of the wide convex pattern 10a by d4. Therefore, the contrast of the exposure light on the wafer is improved due to the edge contrast effect, while shielding most of the exposure light by the wide light shielding portion 11a. It is preferable that, in order to achieve such edge contrast effect, an amount of retreat d4 should be suppressed smaller than the above upper limit value $C_{max}/2$. This $C_{max}$ value is almost 320 nm, for example, although such value becomes different according to the exposure conditions such as the type of the exposure light, etc. In such case, $C_{max}/2$ is 160 nm.

In contrast, the narrow light shielding portions 11b are removed in the small width area B. Thus, the fine and sharp pattern of the exposure light can be obtained on the wafer because of the edge contrast effect of the narrow convex pattern 10b. The width of the narrow convex pattern 10b is the above upper limit value $C_{max}$ (=320 nm), for example.

Figure 9:
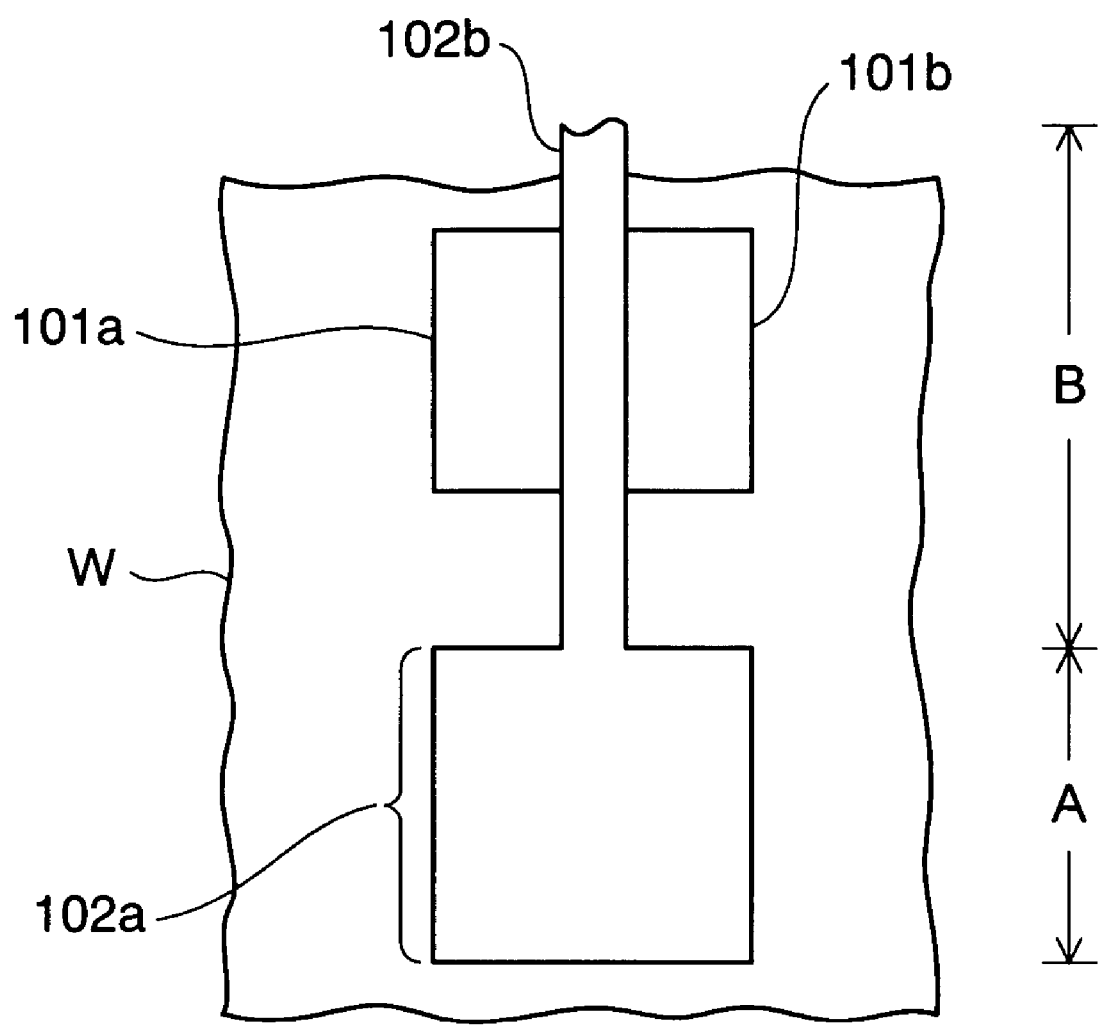
FIG. 9 is a plan view of a semiconductor device manufactured by using the reticle manufactured by respective embodiments of the present invention.

FIG. 9 is an enlarged plan view of a semiconductor device manufactured by using this reticle.

In an example in FIG. 9, a polysilicon layer is formed on a wafer W on which source/drain regions 101a, 101b are formed, and then the above reticle is used in the photolithography upon patterning the polysilicon layer. Thus, a gate electrode 102b and a pad portion 102a formed of the patterned polysilicon layer are formed.

Out of them, the pad portion 102a is a portion on which a conductive plug (not shown) is formed, and has a relatively large pattern, for example, a rectangular shape with one side of 2 μm. This pad portion 102a is patterned to have a planar shape of the wide convex pattern 10a in the large width area A of the above reticle.

Meanwhile, the gate electrode 102b is patterned into a shape of the narrow convex pattern 10b in the small width area B of the reticle. A gate length has a length that is deviated from the width (about 320 nm) of the narrow convex pattern 10b in order of several nm owing to the dimensional correction based on OPC (Optical Proximity Correction).

Such semiconductor device is also manufactured by the second to fifth embodiments described later.

According to the above present embodiment, the wide light shielding portion 11a is retreated from the side surface of the wide convex pattern 10a by retreating the side surface of the first wide mask portion 12a, as shown in FIG. 4I, and then patterning the wide light shielding portion 11a while using the first wide mask portion 12a as a mask, as shown in FIG. 4M. Therefore, an amount of retreat d4 of the wide light shielding portion 11a (see FIG. 4N) becomes substantially equal to an amount of retreat d3 of the first wide mask portion 12a (see FIG. 4I).

As explained in FIG. 4I, since the side surface of the first wide mask portion 12a is retreated by the isotropic etching, an amount of retreat d3 becomes equal on all side surfaces of the first wide mask portion 12a. As a result, respective centers of the first wide mask portion 12a and the wide convex pattern 10a are aligned precisely with each other in a self-align manner.

Therefore, a center of the wide light shielding portion 11a that is patterned by using the first wide mask portion 12a as a mask is also aligned with a center of the wide convex pattern 10a in a self-align manner. Thus, all side surfaces of the wide light shielding portion 11a are retreated from the wide convex pattern 10a by an equal amount of retreat d4. As a result, the brightness of the exposure light passed through the recticle can be made equal at the bottoms of all side surfaces of the wide light shielding portion 11a.

In addition, according to the present embodiment, the resist 16 should be formed only once. Therefore, a quantity of exposure data about the resist pattern formation can be reduced rather than the case where the resist 16 should be formed twice like the prior art, and also a production cost can be reduced because the step of preparing the exposure data can be omitted.

Further, in the present embodiment, the trielevel resist is constructed by the third mask layer 15 and the resist 16, and then the third mask pattern 15e is formed by using the resist pattern 16c as a mask (see FIG. 4C). Therefore, since the third mask pattern 15e that is excellent in the dry etching resistance rather than the case where the lift-off layer 14 is patterned by using the resist pattern 16c that has the low dry-etching resistance is used, the lift-off layer 14 can be patterned finely and also a process precision of the lift-off pattern 14c can be enhanced.

In this case, the present embodiment is not limited to the above. The silicon nitride layer and the silicon dioxide layer may be formed instead of the SOG layer 15b and the resin layer 15a constituting the hard mask 15 respectively. In such case, the silicon nitride layer is formed to have a thickness of 40 nm under the same film forming conditions as the first mask layer 12. Also, the silicon dioxide layer is formed to have a thickness of 160 nm by using TEOS+$O_2$ as a material gas, applying the RF power 200 W having a frequency of 13.56 MHz, and using the pressure 300 Pa and the substrate temperature 350° C. Also, in the steps in FIG. 4B, when the silicon nitride layer is etched by using the resist pattern 16c as a mask, such conditions are employed that $C_4F_8$+CO+$O_2$+Ar is used as the etching gas, the RF power 500 W whose frequency is 13.56 MHz is applied, and the pressure 10 Pa is set. Then, in the steps in FIG. 4C, when the silicon dioxide layer is etched by using this patterned silicon nitride layer as a mask, such conditions are employed that $C_4F_6$+$O_2$+Ar is used as the etching gas, the RF power 100 W whose frequency is 13.56 MHz is applied, and the pressure 30 mTorr is set.

(2) Second Embodiment

Next, a second embodiment of the present invention will be explained hereunder.

The present embodiment gives the processes that are of use when the etching resistance of the resist is sufficiently large.

FIGS. 5A to 5H are sectional views showing a reticle manufacturing method according to a second embodiment of the present invention in order of steps.

Figure 5A:
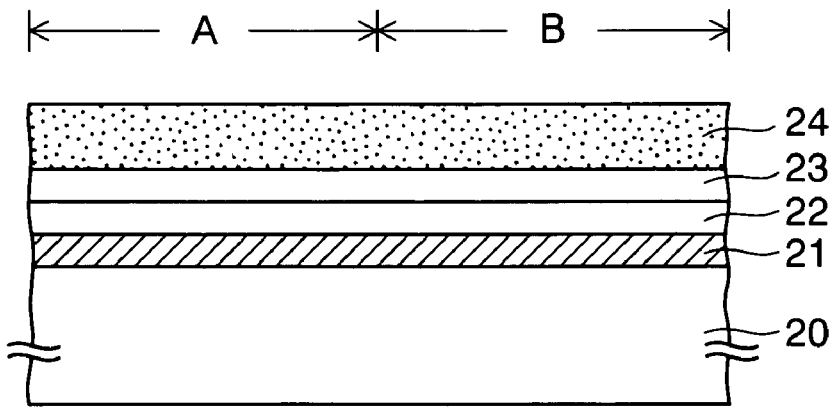
FIGS. 5A to 5H are sectional views showing a reticle manufacturing method according to a second embodiment of the present invention in order of steps.

At first, steps required until a sectional structure showing in FIG. 5A is obtained will be explained hereunder.

First, a Cr layer of about 80 nm thickness is formed as a light shielding layer 21 on a glass substrate (transparent substrate) 20 by the sputter method. Then, a silicon nitride layer of 150 nm thickness is formed on the light shielding layer 21 by the plasma CVD using $SiH_4$+$NH_3$+$N_2$ as a reaction gas, while applying the RF power 400 W having the frequency 13.56 MHz to the reaction gas at the pressure 600 Pa and the substrate temperature 350° C. This layer is used as a lift-off layer 22.

Here the lift-off layer 22 is not limited to the silicon nitride layer if such layer may be formed of the material that is different from the light shielding layer 21. For example, any one of the silicon dioxide layer, the silicon oxide nitride layer, the silicon carbide layer, the silicon oxycarbide layer, the amorphous silicon layer, and the silicon oxide fluoride layer may be formed as the lift-off layer 22 instead of the silicon nitride layer.

Alternately, the lift-off layer 22 may be formed of the metal layer such as the Al layer, the Mg layer, the Sn layer, etc. and the metallic material layer such as the Cr alloy layer, the Cr oxide layer, the Cr nitride layer, the Al alloy layer, the Mg alloy layer, the In alloy layer, the In oxide layer, the Sn alloy layer, the Sn oxide layer, the In—Sn oxide layer, etc.

In addition, a silicon dioxide layer of 150 nm thickness is formed on the lift-off layer 22 by using $SiH_4$+$N_2O$+$N_2$ as a reaction gas, while applying the RF power 400 W having the frequency 13.56 MHz to the reaction gas at the pressure 600 Pa and the substrate temperature 350° C. This layer is used as a mask layer 23.

As the layer constituting the mask layer 23, any one of the silicon nitride layer, the silicon oxide nitride layer, the silicon carbide layer, the silicon oxycarbide layer, the amorphous silicon layer, and the silicon oxide fluoride layer may be formed in addition to the silicon dioxide layer.

Out of them, the silicon carbide layer is formed by the plasma CVD using TMS (tetramethylsilane)+$CO_2$ as a reaction gas, and the film forming conditions of the RF power 600 W having the frequency 13.56 MHz, the pressure 4 Torr, and the substrate temperature 400° C. are employed. Also, the silicon oxycarbide layer is formed by the plasma CVD using TMCTS (tetramethylcyclotetrasiloxane)+$O_2$+$CO_2$ as a reaction gas, and the film forming conditions of the RF power 600 W having the frequency 13.56 MHz, the pressure 4 Torr, and the substrate temperature 400° C. are employed.

Then, a resist such as a chemical amplification type negative resist, or the like is spin-coated on the mask layer 23 and then this resist is prebaked under the conditions of the substrate temperature 90° C. and the process time 20 minute. Thus, a resist 24 of about 250 nm thickness is formed.

Figure 5B:
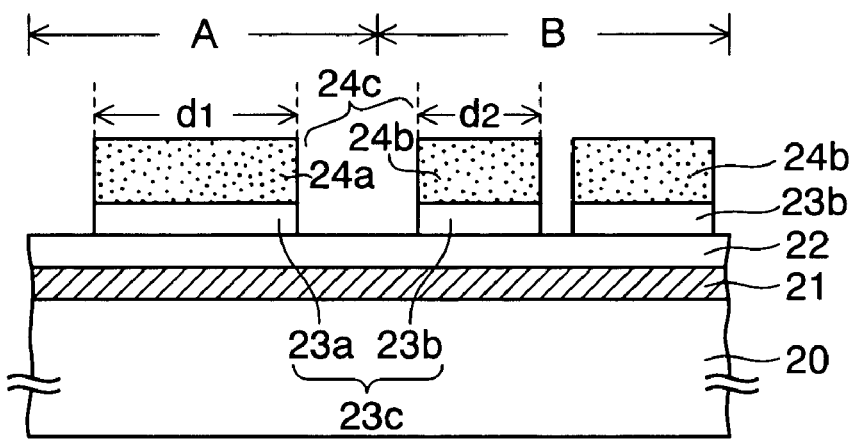

Then, steps required until a sectional structure showing in FIG. 5B is obtained will be explained hereunder.

First, the glass substrate 20 is loaded in the electron beam exposure machine (not shown), and then the resist 24 is exposed by the electron beam by employing the condition of the acceleration voltage 50 KV. Then, a resist pattern 24c having a wide resist portion 24a in the large width area A and also a narrow resist portion 24b in the small width area B is formed by developing the resist 24.

Then, the mask layer 23 made of the silicon dioxide is patterned by the anisotropic plasma etching using $C_4F_6$+$O_2$+Ar as the etching gas, while using the resist pattern 24c as an etching mask at the conditions of the RF power 100 W having the frequency 13.56 MHz and the pressure 30 mTorr. Thus, a mask pattern 23c having a wide mask portion 23a and a narrow mask portion 23b is formed.

In this case, when the silicon carbide layer is formed as the mask layer 23, $CF_4$+$CH_2F_2$+$N_2$ is used as the etching gas and the etching conditions of the RF power 200 W having the frequency 13.56 MHz and the pressure 30 mTorr are employed. Also, when the silicon oxycarbide layer is formed as the mask layer 23, $CF_4$+$CHF_3$+Ar+$N_2$ is used as the etching gas and the etching conditions of the RF power 1000 W having the frequency 13.56 MHz and the pressure 200 mTorr are employed.

Then, the conditions of an oxygen gas flow rate 100 sccm, the pressure 20 Pa, and the RF power 300 W having the frequency 13.56 MHz are set. The resist pattern 24c is removed by the ashing executed in the parallel-plate type etching machine while maintaining the substrate temperature at the room temperature.

Figure 5C:
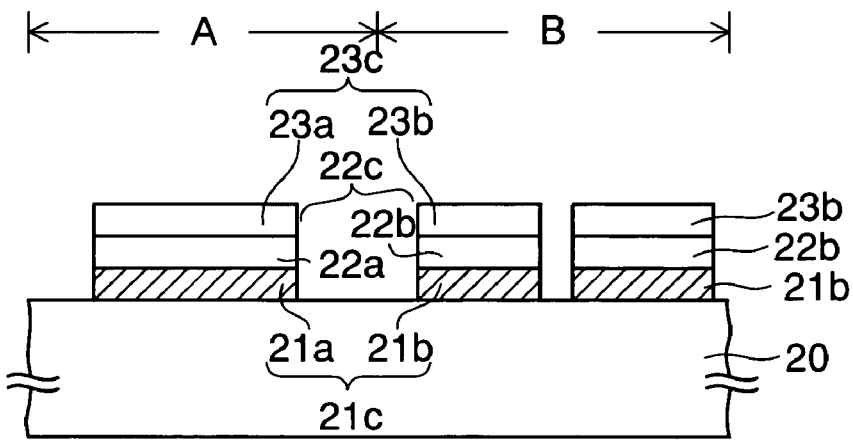

Then, steps required until a sectional structure showing in FIG. 5C is obtained will be explained hereunder.

First, the lift-off layer 22 made of the silicon nitride is etched anisotropically by using $C_4F_8$+CO+$O_2$+Ar as the etching gas, while using the mask pattern 23c as a mask and applying the RF power 500 W having the frequency 13.56 MHz to the etching gas at the pressure 10 Pa. As a result, a lift-off pattern 22c having a wide pattern portion 22a and a narrow pattern portion 22b under the wide mask portion 23a and the narrow mask portion 23b respectively is formed.

Then, the light shielding layer 21 made of chromium is etched by using $Cl_2$+$O_2$ as the etching gas, while using the lift-off pattern 22c as a mask and applying the RF power 300 W having the frequency 13.56 MHz to the etching gas at the pressure 20 Pa. Thus, a light shielding pattern 21c having a wide light shielding portion 21a and a narrow light shielding portion 21b under the wide pattern portion 22a and the narrow pattern portion 22b respectively is formed.

Figure 5D:
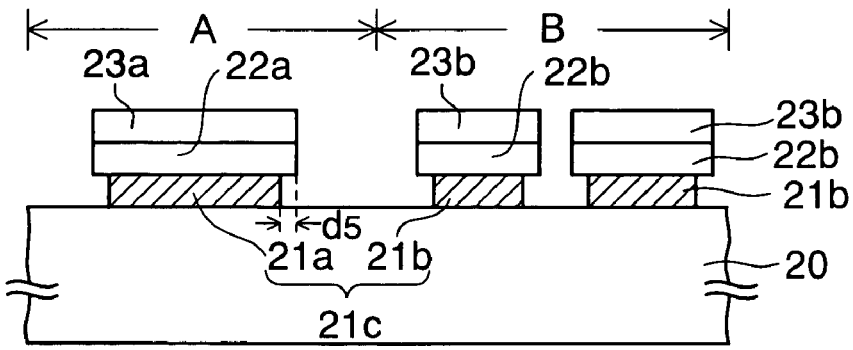

Then, as shown in FIG. 5D, the light shielding pattern 21c made of chromium is wet-etched isotropically and selectively by dipping the glass substrate 10 in the etchant made of the secondary cerium nitride ammon solution. Thus, side surfaces of the light shielding pattern 21c are retreated.

Figure 5E:
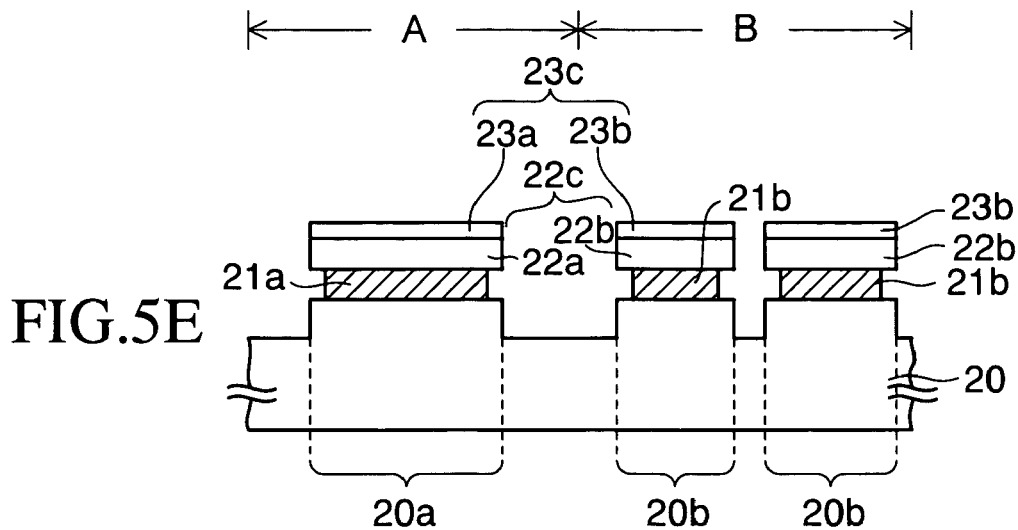

Then, as shown in FIG. 5E, the glass substrate 20 is etched by using the mask pattern 22c as a mask. Thus, a portion of the glass substrate 20 not covered with the mask pattern 22c is reduced in thickness, and also portions of the glass substrate 20, which are not etched and left under the wide mask portion 22a and the narrow mask portion 22b respectively, are formed as a wide convex pattern 20a and a narrow convex pattern 20b respectively. For example, such etching is executed by using $C_4F_6$+$O_2$+Ar as the etching gas under the conditions of the pressure 30 mTorr and the RF power 100 W having the frequency 13.56 MHz.

In addition, since the mask pattern 23c made of the silicon dioxide has the almost same etching rate as the glass substrate 20, a film thickness of the mask pattern 23c is also reduced in this etching.

Figure 5F:
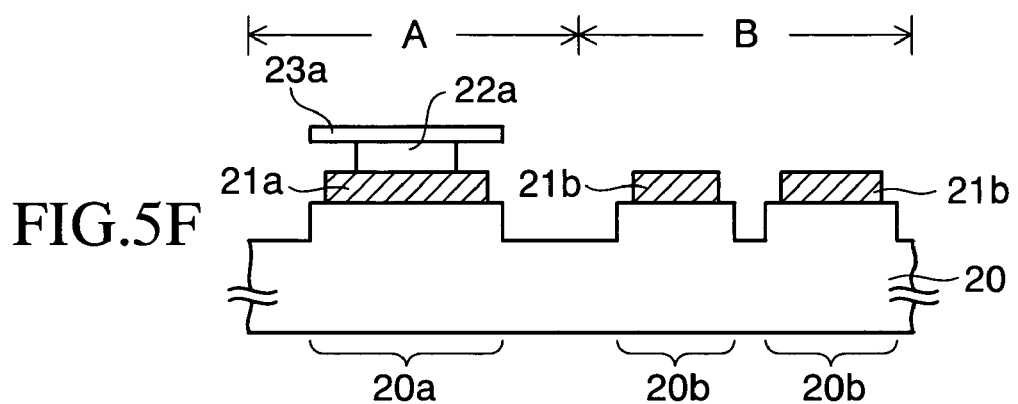

Then, as shown in FIG. 5F, the glass substrate 20 is put into the barrel type reactor, and then the lift-off pattern 22c made of the silicon nitride is etched selectively and isotropically by using $CF_4$+$O_2$ as the etching gas. As a result, side surfaces of the lift-off pattern 22c are retreated and thus the narrow pattern portions 22b are removed and also the overlying narrow mask portions 23b are lifted off.

Figure 5G:
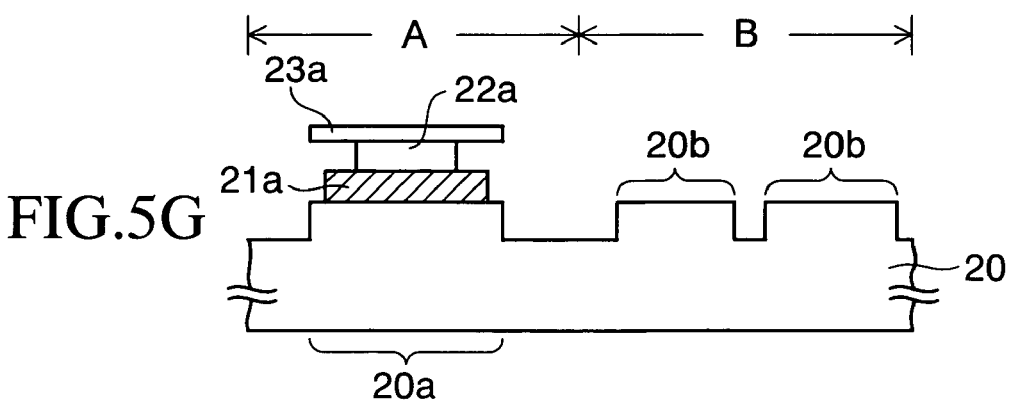

Then, as shown in FIG. 5G, the narrow light shielding portions 21b made of chromium and formed on the narrow convex patterns 20b are removed by the anisotropic etching by using $Cl_2$+$O_2$ as an etching gas under the conditions of the RF power 300 W having the frequency 13.56 MHz and the pressure 20 Pa.

Figure 5H:
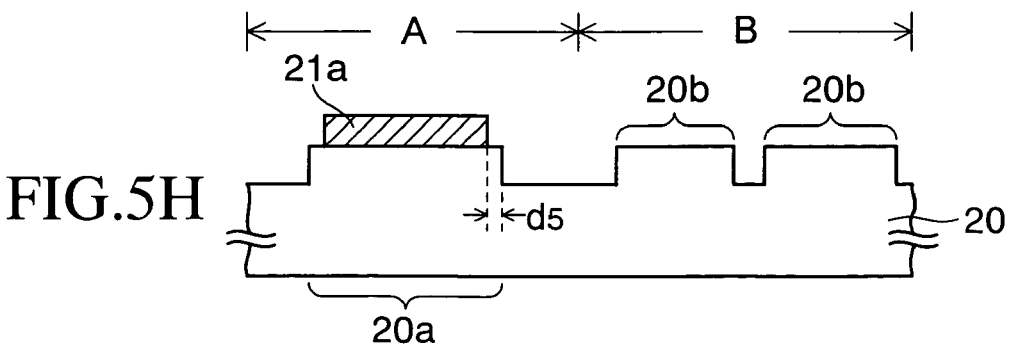

Then, as shown in FIG. 5H, the wide pattern portion 22a and the wide mask portion 23a on the wide light shielding portion 21a are removed.

With the above, a basic structure of the reticle according to the present embodiment is completed.

Like the first embodiment, this reticle is the chromeless reticle. In the large width area A, the wide pattern of the exposure light is formed on the wafer by the wide light shielding portion 21a. In the small width area B, the fine and sharp pattern of the exposure light can be obtained on the wafer by the edge contrast effect of the narrow convex pattern 20b.

Out of them, in the large width area A, the edge contrast effect can be achieved by retreating side surfaces of the wide light shielding portions 21a from side surfaces of the wide convex pattern 20a by d5. It is preferable that, in order to get this effect, an amount of retreat d5 should be set to 160 nm or less for the same reason as the first embodiment.

According to the above embodiment, as explained in FIG. 5D, the side surfaces of the wide light shielding portion 21a are retreated by the isotropic wet etching. At this time, an amount of retreat d5 corresponds to an amount of retreat of the wide light shielding portions 21a from the side surfaces of the wide convex pattern 20a, as shown in FIG. 5H.

When employing such isotropic etching, all side surfaces of the wide light shielding portions 21a are retreated from the wide convex pattern 20a by the same amount, and thus a center of the wide light shielding portions 21a is aligned with a center of the wide convex pattern 20a precisely in a self-align manner. Therefore, the brightness of the exposure light passed through the reticle can be made uniform at the bottoms of all side surfaces of the wide light shielding portions 21a.

In addition, according to the present embodiment, the resist 24 is formed only once, like the first embodiment. Therefore, a quantity of exposure data about the resist pattern formation can be reduced rather than the prior art and also a production cost can be reduced.

In addition, in the first embodiment, the third mask layer 15 used to pattern the lift-off layer 14 and the second mask layer 13 used to form the convex patterns 10a, 10b are formed separately. In contrast, in the present embodiment, only one layer of the mask layer 23 is formed and the lift-off layer 22 and the convex patterns 20a, 20b are patterned by using this mask layer 23 respectively. As a result, the number of steps can be reduced in contrast to the first embodiment, and thus improvement in the cost reduction and the productivity can be attained.

(3) Third Embodiment

Next, a third embodiment of the present invention will be explained hereunder.

Like the second embodiment, the present embodiment also provides the processes that are of use when the etching resistance of the resist is sufficiently large.

FIGS. 6A to 6H are sectional views showing a reticle manufacturing method according to a third embodiment of the present invention in order of steps.

Figure 6A:
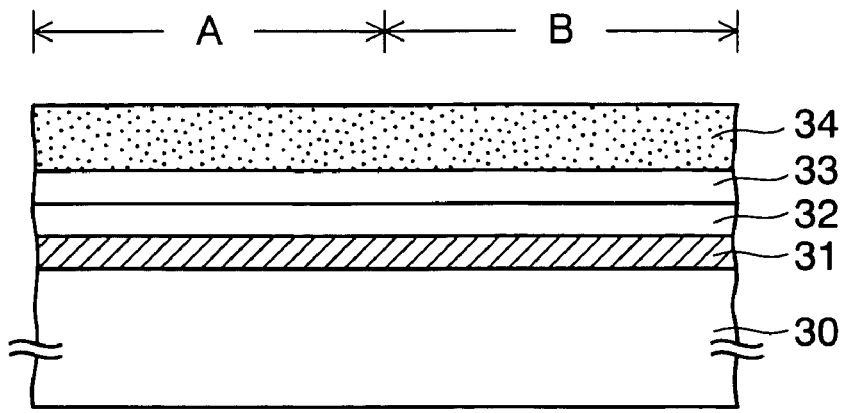
FIGS. 6A to 6H are sectional views showing a reticle manufacturing method according to a third embodiment of the present invention in order of steps.

At first, steps required until a sectional structure showing in FIG. 6A is obtained will be explained hereunder.

First, a Cr layer of about 80 nm thickness is formed as a light shielding layer 31 on a glass substrate (transparent substrate) 30 by the sputter method. Then, a silicon nitride layer of 150 nm thickness is formed on the light shielding layer 31 by the plasma CVD using $SiH_4+NH_3+N_2$ as a reaction gas, while applying the RF power 400 W having the frequency 13.56 MHz to the reaction gas at the pressure 600 Pa and the substrate temperature 350° C. This layer is used as a mask layer 32.

Then, a silicon dioxide layer of 150 nm thickness is formed on the mask layer 32 by using $SiH_4+N_2O+N_2$ as the reaction gas, while applying the RF power 500 W having the frequency 13.56 MHz to the reaction gas under the conditions of the pressure 600 Pa and the substrate temperature 350° C. This layer is used as a lift-off layer 33.

Here, the mask layer 32 and the lift-off layer 33 are formed of different materials mutually and are not limited the silicon nitride layer and the silicon oxide layer, as described above, if such layers are formed of the material that is different from the light shielding layer 31. Respective layers 32, 33 may be formed of any one of the silicon nitride layer, the silicon dioxide layer, the silicon oxide nitride layer, the silicon carbide layer, the silicon oxycarbide layer, the amorphous silicon layer, and the silicon oxide fluoride layer. Otherwise, respective layers 32, 33 may be formed of the metal layer such as the Al layer, the Mg layer, the Sn layer, etc. and the metallic material layer such as the Cr alloy layer, the Cr oxide layer, the Cr nitride layer, the Al alloy layer, the Mg alloy layer, the In layer, the In alloy layer, the In oxide layer, the Sn alloy layer, the Sn oxide layer, the In—Sn oxide layer, etc.

Then, a resist such as the chemical amplification type negative resist, or the like is spin-coated on the lift-off layer 33 and then this resist is prebaked under the conditions of the substrate temperature 90° C. and the process time 20 minute. Thus, a resist 34 of about 250 nm thickness is formed.

Figure 6B:
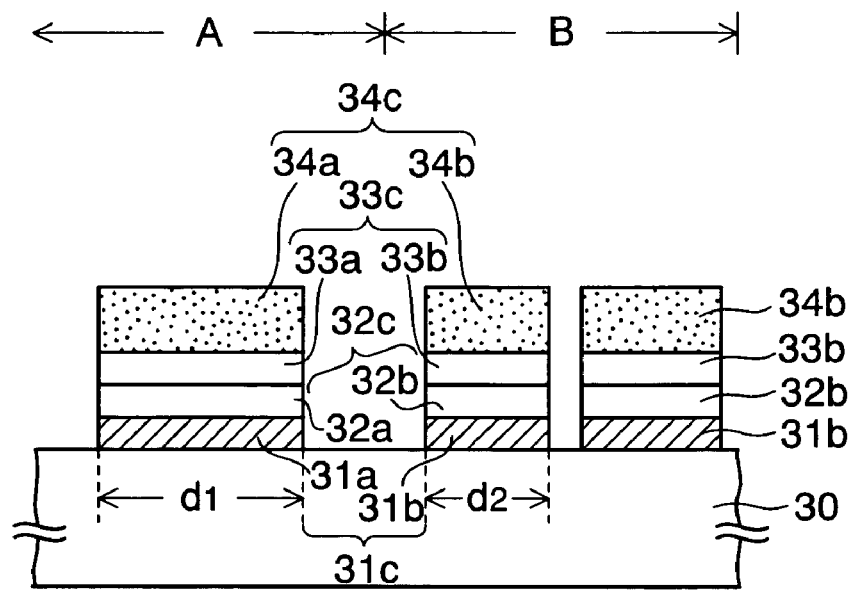

Then, steps required until a sectional structure showing in FIG. 6B is obtained will be explained hereunder.

First, the glass substrate 30 is loaded in the electron beam exposure machine (not shown), and then the resist 34 is exposed by the electron beam by employing the condition of the acceleration voltage 50 KV. Then, a resist pattern 34c having a wide resist portion 34a in the large width area A and also a narrow resist portion 34b in the small width area B is formed by developing the resist 34.

Then, the lift-off layer 33 made of the silicon dioxide is patterned by the anisotropic plasma etching using $C_4F_6+O_2+Ar$ as the etching gas, while using the resist pattern 34c as the etching mask at the conditions of the RF power 100 W having the frequency 13.56 MHz and the pressure 30 mTorr. Thus, a lift-off pattern 33c having a wide pattern portion 33a and a narrow pattern portion 33b is formed.

Then, the mask layer 32 made of the silicon nitride is etched anisotropically by using $C_4F_8+CO+O_2+Ar$ as the etching gas, while using the lift-off pattern 33c as a mask and applying the RF power 500 W having the frequency 13.56 MHz to the etching gas at the pressure 10 Pa. Thus, a mask pattern 32c having a wide mask portion 32a and a narrow mask portion 32b under the wide pattern portion 33a and the narrow pattern portion 33b respectively is formed.

Then, the light shielding layer 31 made of chromium is etched by using $Cl_2+O_2$ as the etching gas, while using the mask pattern 32c as a mask and applying the RF power 300 W having the frequency 13.56 MHz to the etching gas at the pressure 20 Pa. As a result, a light shielding pattern 31c having a wide light shielding portion 31a and a narrow light shielding portion 31b under the wide mask portion 32a and the narrow mask portion 32b respectively is formed.

Figure 6C:
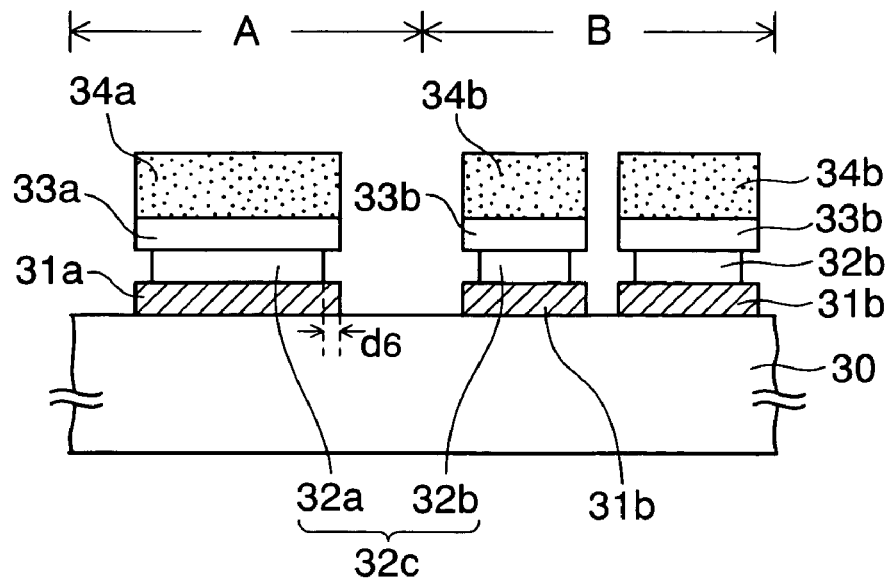

Then, as shown in FIG. 6C, the glass substrate 30 is put into the barrel type reactor (not shown) and then the etching gas composed of $CF_4+O_2$ is introduced into the reactor. Thus, the mask patterns 32c made of silicon nitride are etched selectively and isotropically to retreat the side surfaces of the mask patterns 32c.

Figure 6D:
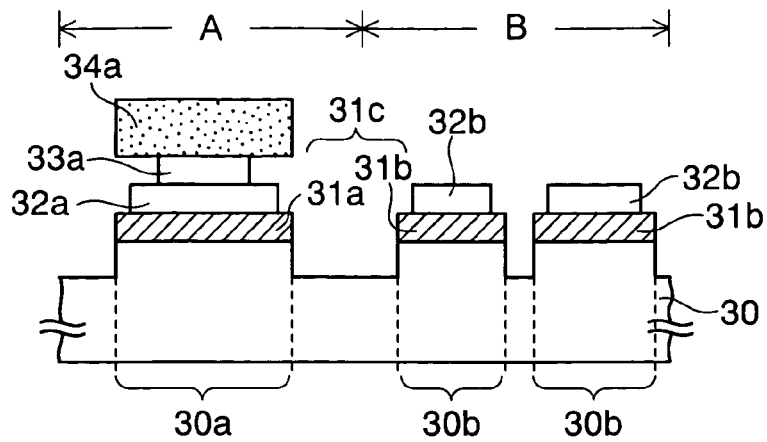

Then, steps required until a sectional structure showing in FIG. 6D is obtained will be explained hereunder.

First, the lift-off pattern 33c made of silicon dioxide is etched selectively and isotropically by dipping the glass substrate 30 into the hydrofluoric acid solution in which a ratio of $HF:H_2O$ is set to 1:200. As a result, side surfaces of the lift-off pattern 33c are retreated and thus the narrow pattern portions 33b are removed and also the overlying narrow mask portions 34b are lifted off.

Here, when the lift-off pattern 33c is formed of the silicon nitride layer, a phosphoric acid solution is used as the above etchant.

Then, the glass substrate 30 is anisotropically etched by using the light shielding pattern 31c as a mask. Thus, a portion of the glass substrate 30 not covered with the light shielding pattern 31c is reduced in thickness, and also portions of the glass substrate 30, which are not etched and left under the wide light shielding portion 31a and the narrow light shielding portion 31b respectively, are formed as a wide convex pattern 30a and a narrow convex pattern 30b respectively. For example, such etching is executed by using $C_4F_6+O_2+Ar$ as the etching gas under the conditions of the pressure 30 mTorr and the RF power 100 W having the frequency 13.56 MHz.

Figure 6E:
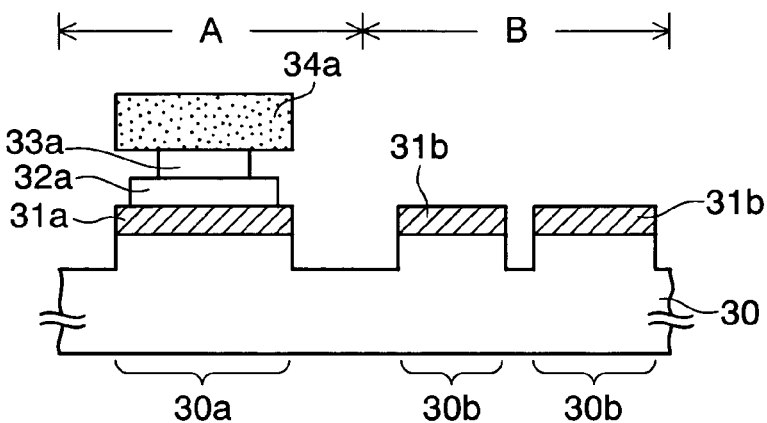

Then, as shown in FIG. 6E, the narrow mask portion 32b made of the silicon nitride on the narrow light shielding portion 31b is removed by the anisotropic etching. In this etching, for example, $C_4F_8+CO+O_2+Ar$ is used as the etching gas and the conditions of the RF power 100 W having the frequency 13.56 MHz and the pressure 10 Pa are employed.

Figure 6F:
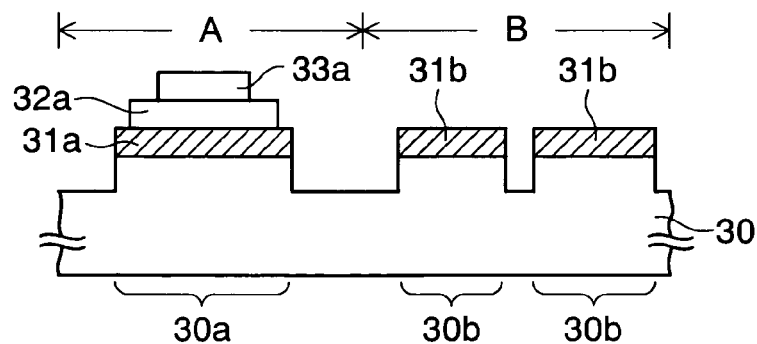

Then, as shown in FIG. 6F, the wide resist portion 34a is removed by the ashing in the parallel-plate type etching machine in which the substrate temperature is kept at the room temperature, while employing the conditions of the oxygen gas flow rate 100 sccm, the pressure 20 Pa, and the RF power 300 W whose frequency is 13.56 MHz.

Figure 6G:
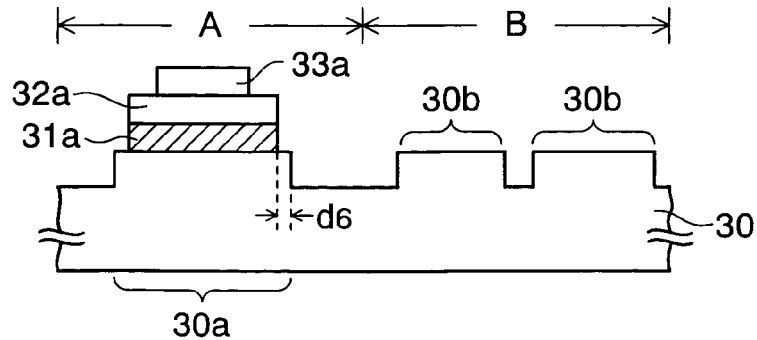

Then, as shown in FIG. 6G, the wide light shielding layer 31$a$ is anisotropically etched by using the wide mask portion 32$a$ as a mask. Thus, an area of the wide light shielding portion 31$a$ is reduced and also the narrow light shielding portions 31$b$ are removed. For example, this etching is carried out under the conditions that $Cl_2+O_2$ is used as the etching gas, the pressure is set to 20 Pa, and the RF power whose frequency is 13.56 MHz is set to 300 W.

Figure 6H:
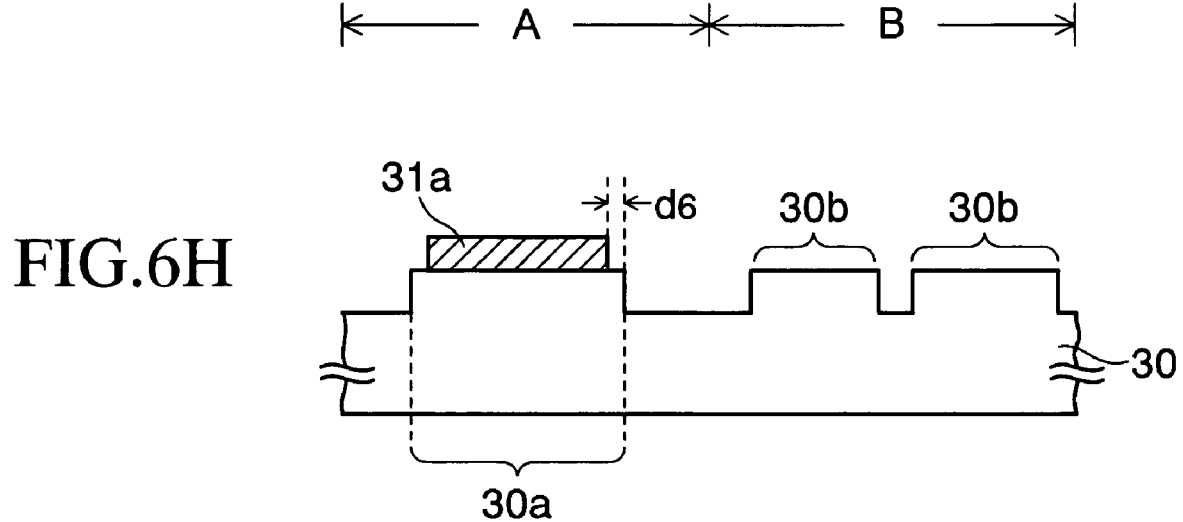

Then, as shown in FIG. 6H, the wide mask portion 32$a$ and the wide pattern portion 33$a$ on the wide light shielding portion 31$a$ are removed. Thus, a basic structure of the reticle according to the present embodiment is completed.

The functions of the reticle in the large width area A and the small width area B are similar to those in the first and second embodiments already described. The edge contrast effect can be preferably achieved by setting an amount of retreat d6 of the side surfaces of the wide light shielding portion 31$a$ to 160 nm or less in the large width area A.

In the above present embodiment, the side surfaces of the wide mask portion 32$a$ are retreated by a distance d6 by the isotropic etching explained in FIG. 6C. Then, as shown in FIG. 6G, since the wide light shielding portion 31$a$ is etched by using the wide mask portion 32$a$ as a mask, the wide light shielding portion 31$a$ goes back by an amount of retreat d6 from the side surface of the wide convex pattern 30$a$.

Accordingly, all side surfaces of the wide light shielding portions 31$a$ are retreated from the wide convex pattern 30$a$ by the same amount, and thus a center of the wide light shielding portions 31$a$ is aligned precisely with a center of the wide convex pattern 30$a$ in a self-align manner. Therefore, the brightness of the exposure light passed through the reticle can be made uniform at the bottoms of all side surfaces of the wide light shielding portions 31$a$.

In addition, according to the present embodiment, like the first and second embodiments, the formation of the resist 34 is required only once. Therefore, a quantity of exposure data about the resist pattern formation can be reduced rather than the prior art, and also a production cost can be reduced.

In addition, the second mask pattern 13$c$ is formed to form the convex patterns 10$a$, 10$b$ in the first embodiment whereas the light shielding pattern 31$c$ is also used as a mask in forming the convex patterns 30$a$, 30$b$ in the present embodiment. As a result, according to the present embodiment, the number of steps can be reduced in contrast to the first embodiment, and thus improvement in the cost reduction and the productivity can be attained.

(4) Fourth Embodiment

Next, a fourth embodiment of the present invention will be explained hereunder.

Like the second and third embodiments, the present embodiment also provides the processes that are of use when the etching resistance of the resist is sufficiently large.

FIGS. 7A to 7F are sectional views showing a reticle manufacturing method according to a fourth embodiment of the present invention in order of steps. In these Figures, the same reference numerals are affixed to the same constituent elements as those in the foregoing third embodiment, and their explanation will be omitted herein.

Figure 7A:
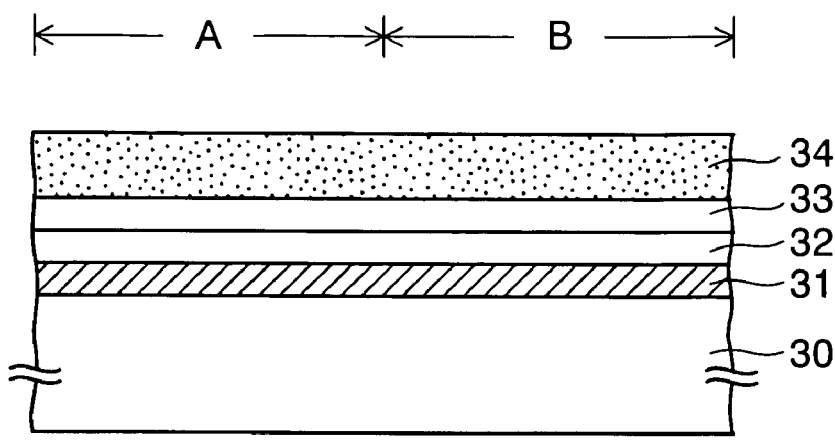
FIGS. 7A to 7F are sectional views showing a reticle manufacturing method according to a fourth embodiment of the present invention in order of steps.

First, as shown in FIG. 7A, the light shielding layer 31, the mask layer 32, the lift-off layer 33, and the resist layer 34 are formed sequentially on the glass substrate 30. The material and the film forming conditions of respective layers are similar to the third embodiment.

Figure 7B:
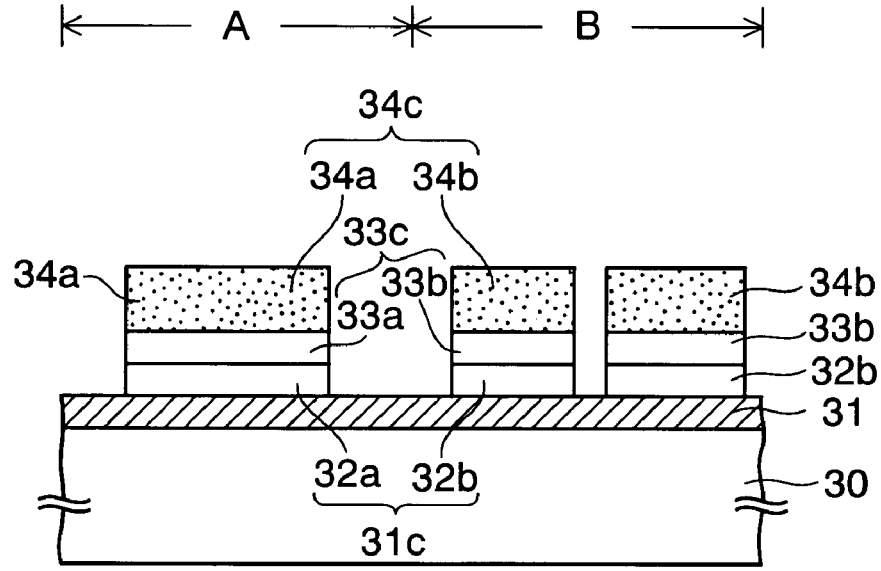

Then, as shown in FIG. 7B, the resist pattern 34$c$, the lift-off pattern 33$c$, and the mask pattern 32$c$ are formed by employing the same methods as those in the third embodiment. Then, the resist pattern 34$c$ is removed after respective patterns 33$c$, 32$c$ are formed.

Figure 7C:
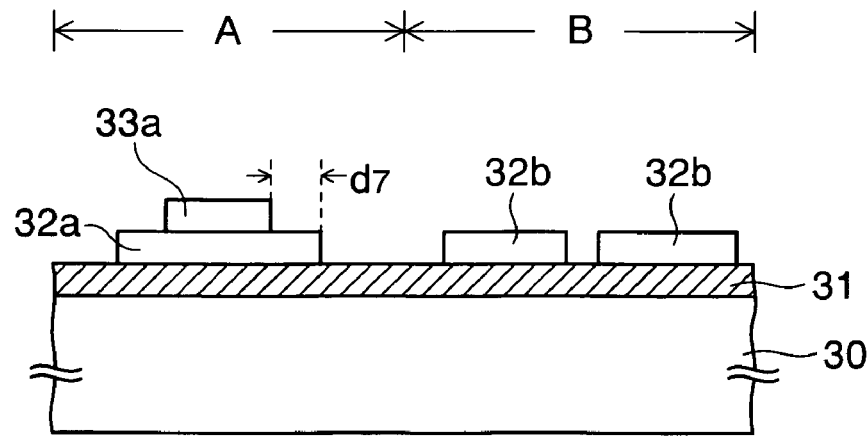

Then, as shown in FIG. 7C, first the lift-off pattern 33$c$ made of silicon dioxide is etched selectively and isotropically by dipping the glass substrate 30 into the hydrofluoric acid solution in which a ratio of $HF:H_2O$ is set to 1:200. Thus, the side surfaces of the lift-off pattern 33$c$ are retreated and also an area of the wide pattern portion 33$a$ is reduced, and thus the narrow pattern portions 33$b$ are removed and also the resist pattern 34$c$ is lifted off.

Here, when the lift-off pattern 33$c$ is formed of the silicon nitride layer, the phosphoric acid solution is used as the above etchant.

Figure 7D:
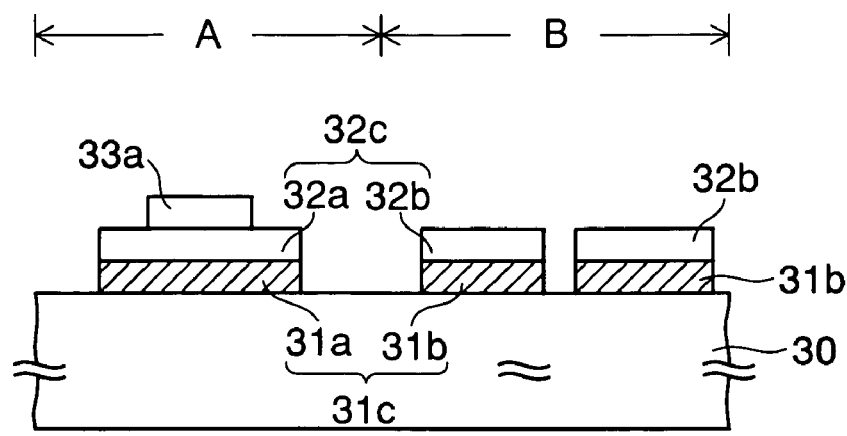

Then, as shown in FIG. 7D, the light shielding layer 31 is etched by using the mask pattern 32$c$ as a mask. Thus, the light shielding pattern 31$c$ having the wide light shielding portion 31$a$ and the narrow light shielding portion 31$b$ under the wide mask portion 32$a$ and the narrow mask portion 32$b$ respectively is formed. For example, this etching is executed under the conditions that $Cl_2+O_2$ is used as the etching gas, the pressure is set to 20 Pa, and the RF power whose frequency is 13.56 MHz is set to 300 W.

Figure 7E:
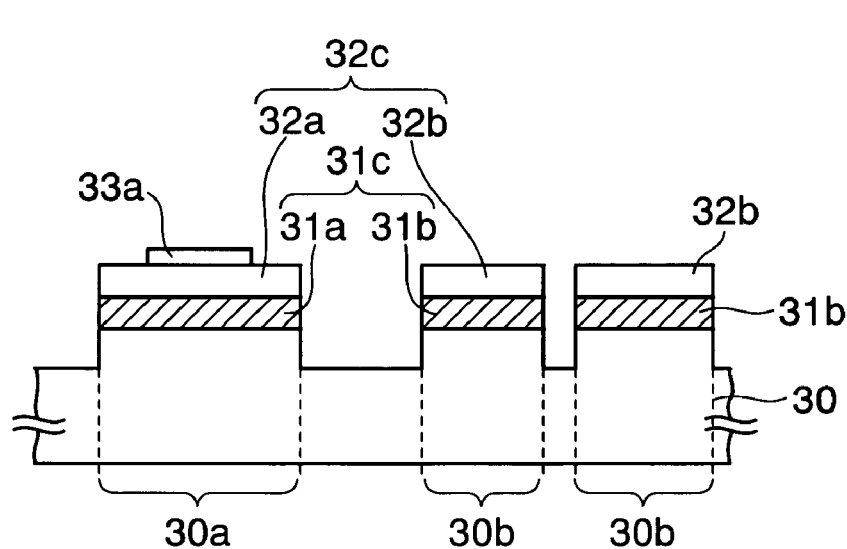

Then, as shown in FIG. 7E, the glass substrate 30 is anisotropically etched by using the light shielding pattern 31$c$ as a mask. Thus, a portion of the glass substrate 30 not covered with the light shielding pattern 31$c$ is reduced in thickness, and also portions of the glass substrate 30, which are not etched and left under the wide light shielding portion 31$a$ and the narrow light shielding portion 31$b$ respectively, are formed as the wide convex pattern 30$a$ and the narrow convex pattern 30$b$ respectively. For example, such etching is executed by using $C_4F_6+O_2+Ar$ as the etching gas under the conditions of the pressure 30 mTorr and the RF power 100 W having the frequency 13.56 MHz.

In this case, in this etching, a film thickness of the wide pattern portion 33$a$ made of the silicon dioxide is also reduced by the etching.

Figure 7F:
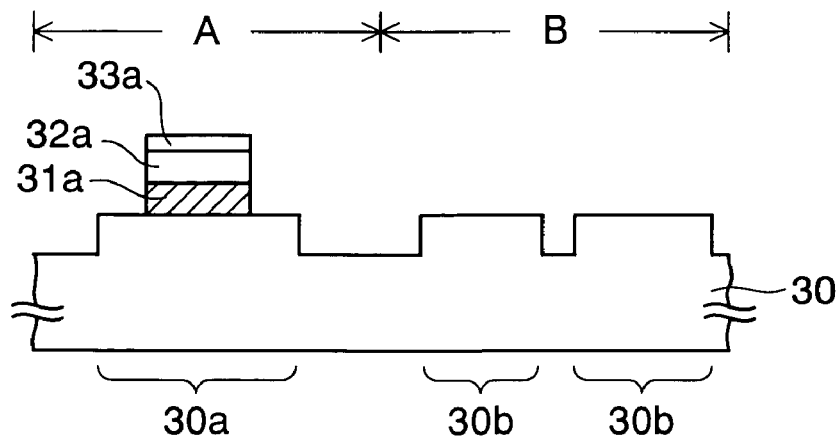

Then, steps required until a sectional structure showing in FIG. 7F is obtained will be explained hereunder.

First, the mask pattern 32$c$ is etched by using the wide pattern portion 33$a$ as a mask, while using $C_4F_8+CO+O_2+Ar$ as the etching gas under the conditions of the RF power 500 W having the frequency 13.56 MHz and the pressure 10 Pa. Thus, an area of the wide mask portion 32$a$ is reduced and also the narrow mask portion 32$b$ is removed.

Then, the light shielding pattern 31$c$ is etched by using the wide mask portion 32$a$ as a mask. Thus, an area of the wide light shielding portion 31$a$ is reduced and also the narrow light shielding portion 31$b$ is removed. For example, this etching is executed under the conditions that $Cl_2+O_2$ is used as the etching gas, the pressure is set to 20 Pa, and the RF power whose frequency is 13.56 MHz is set to 300 W.

Then, the wide mask portion 32$a$ and the wide pattern portion 33$a$ on the wide light shielding portion 31$a$ are removed. Thus, a basic structure of the reticle according to the present embodiment, which is similar to that shown in FIG. 6H, is completed.

In the above embodiment, the side surfaces of the wide pattern portion 33$a$ are retreated by the isotropic etching upon lifting off the resist pattern 34$c$ in the step in FIG. 7C, but respective amounts of retreat d7 of all side surfaces are equal mutually. Therefore, all side surfaces of both the wide mask portion 32$a$, which is etched by using the wide pattern 33$a$ as a mask, and the wide light shielding portions 31$a$, which is etched by using the wide mask portion 32*a* as a mask, are retreated from the side surfaces of the wide convex pattern 30*a* by the same amount. As a result, the brightness of the exposure light passed through the reticle can be made uniform at the bottoms of all side surfaces of the wide light shielding portions 31*a*.

In addition, like the first to third embodiments, the formation of the resist 34 is needed only once. Therefore, a quantity of exposure data about the resist pattern formation can be reduced rather than the prior art, and also a production cost can be reduced.

Also, in the first embodiment, both the first mask layer 12 used to decide the final width of the wide light shielding portion 11*a* and the lift-off layer 14 used to lift off the third narrow mask portion 15*d* are needed. In contrast, in the present embodiment, the lift-off layer 33 can be used to decide the lift-off pattern 33*c* and then the lift-off pattern 33*c* can be used not only to decide the final width of the wide light shielding portion 31*a* but also to lift off the resist pattern 34. As a result, the number of layers to be formed can be reduced rather than the first embodiment, and therefore the number of steps can be reduced and in turn improvement in the cost reduction and the productivity can be brought about.

(5) Fifth Embodiment

Next, a fifth embodiment of the present invention will be explained hereunder.

FIGS. 8A to 8D are sectional views showing a reticle manufacturing method according to a fifth embodiment of the present invention in order of steps.

Figure 8A:
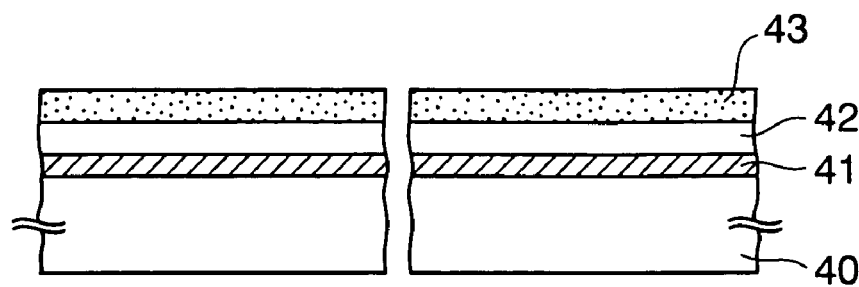
FIGS. 8A to 8D are sectional views showing a reticle manufacturing method according to a fifth embodiment of the present invention in order of steps.

At first, steps required until a sectional structure showing in FIG. 8A is obtained will be explained hereunder.

First, a Cr layer of about 80 nm is formed as a light shielding layer 41 on a glass substrate 40 by the sputter method. Then, a silicon dioxide layer of 100 nm thickness is formed on the light shielding layer 41 by using $SiH_4+N_2O+N_2$ as the reaction gas, while applying the RF power 400 W having the frequency 13.56 MHz to the reaction gas at the pressure 600 Pa and the substrate temperature 350° C. This layer is used as a lift-off layer 42.

Here, the lift-off layer 42 is not limited to the silicon dioxide layer if such layer is composed of the material that is different from the light shielding layer 41. For example, any one of the silicon nitride layer, the silicon oxide nitride layer, the silicon carbide layer, the silicon oxycarbide layer, the amorphous silicon layer, and the silicon oxide fluoride layer may be formed.

Otherwise, the lift-off layer 42 may be formed of the metal layer such as the Al layer, the Mg layer, the Sn layer, etc. and the metallic material layer such as the Cr alloy layer, the Cr oxide layer, the Cr nitride layer, the Al alloy layer, the Mg alloy layer, the In layer, the In alloy layer, the In oxide layer, the Sn alloy layer, the Sn oxide layer, the In—Sn oxide layer, etc.

Then, a resist such as a chemical amplification type negative resist, or the like is spin-coated on the lift-off layer 42 and then this resist is prebaked under the conditions of the substrate temperature 90° C. and the process time 20 minute. Thus, a resist 43 of about 400 nm thickness is formed.

Figure 8B:
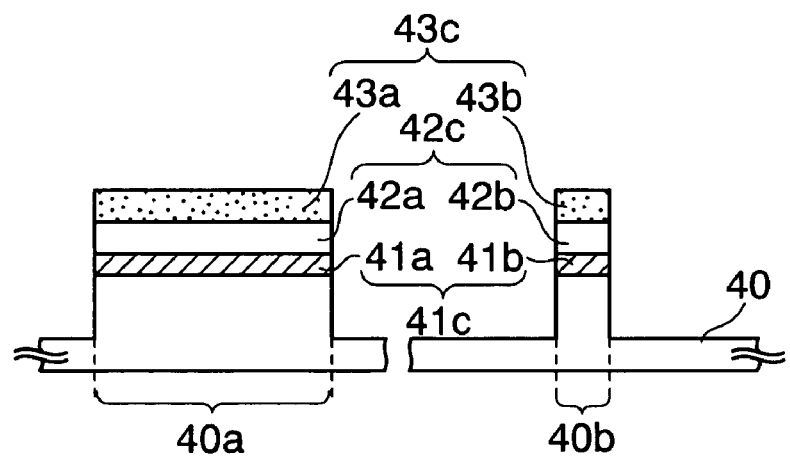

Then, steps required until a sectional structure showing in FIG. 8B is obtained will be explained hereunder.

First, the glass substrate 40 is loaded in the electron beam exposure machine (not shown), and then the resist 43 is exposed by drawing the pattern on the resist 43 under the condition of an acceleration voltage 50 KV of the electron beam. Then, the glass substrate 40 is taken out from the electron beam exposure machine, and then the resist 43 is postbaked under the conditions of the substrate temperature 90° C. and the process time 20 minute. Then, a resist pattern 43*c* having a wide resist portion 43*a* in the large width area A and a narrow resist portion 43*b* in the small width area B is formed by developing the resist 43. Then, the resist pattern 43*c* is rinsed by using the pure water.

Then, the lift-off layer 42 is anisotropically etched by using the resist pattern 43*c* as a mask. Thus, a lift-off pattern 42*c* having a wide pattern portion 42*a* and a narrow pattern portion 42*b* under the wide resist portion 43*a* and the narrow resist portion 43*b* respectively is formed.

As such etching, the plasma etching executed by using $C_4F_6+O_2+Ar$ as the etching gas under the conditions of the RF power 100 W having the frequency 13.56 MHz and the pressure 30 mTorr, for example, is employed.

Then, the light shielding layer 41 is etched by using the lift-off pattern 42*c* as a mask, while $Cl_2+O_2$ as the etching gas under the conditions of the RF power 500 W having the frequency 13.56 MHz and the pressure 50 mTorr. Thus, a light shielding pattern 41*c* having a wide light shielding portion 41*a* and a narrow light shielding portion 41*b* under the wide pattern portion 42*a* and the narrow pattern portion 42*b* respectively is formed.

Then, the glass substrate 40 is anisotropically etched by using the light shielding pattern 41*c* as a mask. Thus, a portion of the glass substrate 40 not covered with the light shielding pattern 41*c* is reduced in thickness, and also portions of the glass substrate 40, which are not etched and left under the wide light shielding portion 41*a* and the narrow light shielding portion 41*b* respectively, are formed as a wide convex pattern 40*a* and a narrow convex pattern 40*b* respectively. For example, such etching is executed by using $C_4F_6+O_2+Ar$ as the etching gas under the conditions of the pressure 30 mTorr and the RF power 100 W having the frequency 13.56 MHz.

Figure 8C:
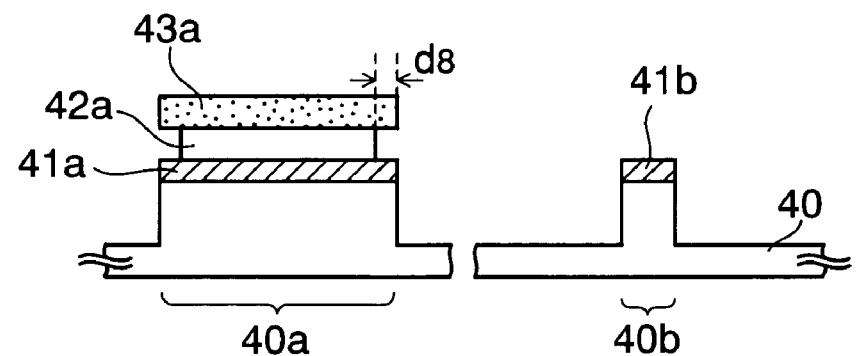

Then, as shown in FIG. 8C, the lift-off pattern 42*c* made of silicon dioxide is wet-etched by dipping the glass substrate 40 into the hydrofluoric acid solution in which a ratio of $HF:H_2O$ is set to 1:200. Thus, the side surfaces of the lift-off pattern 42*c* are retreated. As a result, an area of the wide pattern portion 42*a* of the lift-off pattern 42*c* is reduced, and also the narrow resist pattern 43*b* on the narrow pattern portion 42*b* is lifted off.

In this case, the selective etching ratio of the lift-off pattern 42*c* and the glass substrate 40 is in excess of 40 in the hydrofluoric acid solution having the above concentration. Therefore, the glass substrate 40 is seldom etched and therefore an amount of scrape of the glass substrate 40 can be neglected.

Here, when the silicon nitride layer is formed as the lift-off layer 42, the phosphoric acid solution is used as the above wet etchant.

Figure 8D:
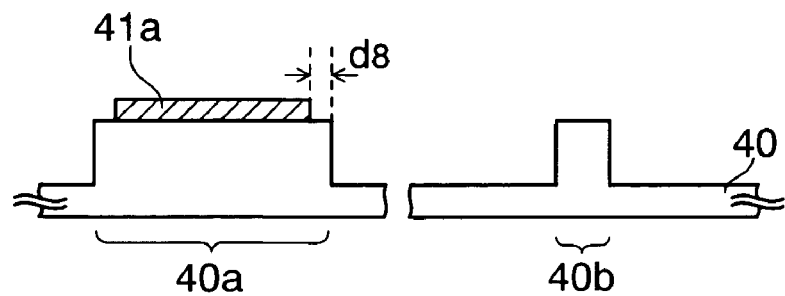

Then, steps required until a sectional structure showing in FIG. 8D is obtained will be explained hereunder.

First, the conditions of the oxygen gas flow rate 100 sccm, the pressure 20 Pa, and the RF power 300 W having the frequency 13.56 MHz are employed. The wide resist pattern 43*a* is removed by the ashing executed in the parallel-plate type etching machine in which the substrate temperature is kept at the room temperature.

Then, the light shielding pattern 41*c* is anisotropically etched by using the wide pattern portion 42*a* as a mask, while using $Cl_2+O_2$ as the etching gas under the conditions of the pressure 20 Pa and the RF power 300 W having the frequency 13.56 MHz. Thus, an area of the wide light shielding portion 41*a* is reduced and the narrow light shielding portion 41*b* is removed.

Then, the wide pattern portion 42a is removed.

With the above, a basic structure of the reticle according to the present embodiment is completed.

This reticle is the chromeless reticle. As explained in the first embodiment, the edge contrast effect can be preferably achieved by setting an amount of retreat d8 of the side surfaces of the wide light shielding portion 41a to 160 nm or less in the large width area A.

According to the above present embodiment, in the step explained in FIG. 8C, the side surfaces of the wide pattern portion 42a are retreated by the isotropic etching by a distance d8, and then the underlying wide light shielding portion 41a is etched by using the wide pattern portion 42a as a mask. Since an amount of retreat of the wide pattern portion 42a is substantially equal on all side surfaces, all side surfaces of the wide light shielding portion 41a etched by using the wide pattern portion 42a as a mask are retreated from the side surface of the wide convex pattern 40a by the same amount of retreat d8. Therefore, a center of the wide light shielding portions 41a is aligned precisely with a center of the wide convex pattern 40a in a self-align manner. As a result, the brightness of the exposure light passed through the reticle can be made uniform at the bottoms of all side surfaces of the wide light shielding portions 41a.

In addition, like the first to fourth embodiments, the resist 34 is formed only once. Therefore, a quantity of exposure data about the resist pattern formation can be reduced rather than the prior art, and also a production cost can be reduced.

Further, in the present embodiment, the number of layers to be formed on the glass substrate 40 is only three, and the number of steps can be reduced in comparison with the first to fourth embodiments. As a result, the cost can be reduced rather than the first to fourth embodiments and also the productivity can be improved.

FIG. 10 is a table in which respective steps in the prior art and the present embodiment are compared mutually.

As shown in FIG. 10, in the prior art, the resist pattern should be formed twice, so the steps 9 to 14, 16 are needed. According to the present embodiment, these steps are not needed. Also, even though the steps 2, 6, 15, 18, 19 required newly in the present embodiment are taken into account, the number of steps can be reduced rather than the prior art and also the cost can be reduced.

Upon applying the present invention to the actual mass-producing steps, any one among the first to fifth embodiments may be chosen with regard to the workability of the film, the adhesiveness, the film forming property, etc. For example, the metal layer such as the chromium layer, the aluminum layer, or the like is excellent in the adhesiveness and the workability, and also is excellent in the isotropic etching and the etching selectivity as well as the anisotropic etching. Also, the inorganic silicon nitride layer has the easy-etch property. Also, the silicon nitride layer and the silicon dioxide layer have been recognized their performances in the semiconductor manufacturing steps, and various properties have been investigated and their processing methods have already been established.

As described above, according to the present invention, the wide light shielding portion and the wide convex pattern of the transparent substrate can be aligned mutually in a self-align manner. Therefore, the brightness of the exposure light that is passed through the reticle can be set equal at the bottoms of all side surfaces of the wide light shielding portion.

In addition, the number of resist layers to be formed is only a single layer. Therefore, exposure data about the resist pattern formation can be reduced small rather than the prior art in which two resists for the wide convex pattern and the wide light shielding portion are needed, and also a time and labor required to prepare the exposure data can be saved and thus a production cost can be reduced correspondingly.

What is claimed is:

1. A reticle manufacturing method comprising:
    a step of forming a light shielding layer, a first mask layer, a second mask layer, a lift-off layer, and a third mask layer in this order on a transparent substrate;
    a step of patterning the third mask layer to form a third mask pattern having a third wide mask portion and a third narrow mask portion;
    a step of etching the lift-off layer while using the third mask pattern as a mask, to form a lift-off pattern having a wide pattern portion and a narrow pattern portion under the third wide mask portion and the third narrow mask portion respectively;
    a step of etching the second mask layer while using the lift-off pattern as a mask, to form a second mask pattern having a second wide mask portion and a second narrow mask portion under the wide pattern portion and the narrow pattern portion respectively;
    a step of retreating side surfaces of the lift-off pattern, to remove the narrow pattern portion and thus lift off the third narrow mask portion on the narrow pattern portion and to reduce an area of the wide pattern portion;
    a step of etching the first mask layer while using the second mask pattern as a mask, to form a first mask pattern having a first wide mask portion and a first narrow mask portion under the second wide mask portion and the second narrow mask portion respectively;
    a step of etching the light shielding layer while using the first mask pattern as a mask, to form a light shielding pattern having a wide light shielding portion and a narrow light shielding portion under the first wide mask portion and the first narrow mask portion respectively;
    a step of etching the transparent substrate while using the light shielding mask pattern as a mask, to reduce a thickness of a portion of the transparent substrate not covered with the second mask pattern and to make portions of the transparent substrate not etched and left under the wide mask portion and the narrow mask portion into a wide convex pattern and a narrow convex pattern respectively;
    a step of removing the third mask pattern;
    a step of retreating side surfaces of the first mask pattern to reduce an area of the first wide mask portion;
    a step of etching the second mask pattern to reduce at least an area of the second wide mask portion smaller than an area of the first wide mask portion;
    a step of etching the wide light shielding portion while using the first wide mask portion as a mask to reduce an area of the wide light shielding portion; and
    a step of removing the narrow light shielding portion.

2. A reticle manufacturing method according to claim 1, wherein the step of retreating side surfaces of the first mask pattern is executed by isotropically etching the first mask pattern.

3. A reticle manufacturing method according to claim 1, wherein any one of a silicon nitride layer, a silicon dioxide layer, a silicon oxide nitride layer, a silicon carbide layer, a silicon oxycarbide layer, an amorphous silicon layer, and a silicon oxide fluoride layer is formed as at least one layer of the first mask layer, the second mask layer, and the lift-off layer.

4. A reticle manufacturing method according to claim 1, wherein a metal layer or a metallic material layer is formed as the lift-off layer.

5. A reticle manufacturing method according to claim 4, wherein any one of an aluminum layer, a magnesium layer, an indium layer, a chromium layer, and a tin layer is formed as the metal layer, and any one of a chromium alloy layer, a chromium oxide layer, a chromium nitride layer, an aluminum alloy layer, a magnesium alloy layer, an indium alloy layer, an indium oxide layer, a tin alloy layer, a tin oxide layer, and an indium-tin oxide layer is formed as the metallic material layer.

6. A reticle manufacturing method comprising:
- a step of forming a light shielding layer, a lift-off layer, a mask layer, and a resist in this order on a transparent substrate;
- a step of exposing and developing the resist to form a resist pattern having a wide resist portion and a narrow resist portion
- a step of etching the mask layer while using the resist pattern as a mask to form a mask pattern having a wide mask portion and a narrow mask portion under the wide resist portion and the narrow resist portion respectively;
- a step of etching the lift-off layer while using the mask pattern as a mask, to form a lift-off pattern having a wide pattern portion and a narrow pattern portion under the wide mask portion and the narrow mask portion respectively;
- a step of etching the light shielding layer while using the lift-off pattern as a mask, to form a light shielding mask pattern having a wide light shielding portion and a narrow light shielding portion under the wide pattern portion and the narrow pattern portion respectively;
- a step of retreating side surfaces of the light shielding pattern;
- a step of etching the transparent substrate while using the light shielding pattern as a mask, to reduce a thickness of a portion of the transparent substrate not covered with the mask pattern and to make portions of the transparent substrate not etched and left under the wide mask portion and the narrow mask portion into a wide convex pattern and a narrow convex pattern respectively;
- a step of retreating side surfaces of the lift-off pattern to remove the narrow pattern portion and thus lift off the narrow mask portion on the narrow pattern portion; and
- a step of removing the narrow light shielding portion.

7. A reticle manufacturing method according to claim 6, wherein the step of retreating side surfaces of the light shielding pattern is executed by isotropically etching the light shielding pattern.

8. A reticle manufacturing method comprising:
- a step of forming a light shielding layer, a mask layer, a lift-off layer, and a resist in this order on a transparent substrate;
- a step of exposing and developing the resist to form a resist pattern having a wide resist portion and a narrow resist portion;
- a step of etching the lift-off layer while using the resist pattern as a mask, to form a lift-off pattern having a wide pattern portion and a narrow pattern portion under the wide resist portion and the narrow resist portion respectively;
- a step of etching the mask layer while using the lift-off pattern as a mask, to form a mask pattern having a wide mask portion and a narrow mask portion under the wide pattern portion and the narrow pattern portion respectively;
- a step of etching the light shielding layer while using the mask pattern as a mask, to form a light shielding pattern having a wide light shielding portion and a narrow light shielding portion under the wide mask portion and the narrow mask portion respectively;
- a step of retreating side surfaces of the mask pattern;
- a step of retreating side surfaces of the lift-off pattern, to remove the narrow pattern portion and thus lift off the narrow mask portion and the narrow resist portion on the narrow pattern portion;
- a step of etching the transparent substrate while using the light shielding pattern as a mask, to reduce a thickness of a portion of the transparent substrate not covered with the light shielding pattern and to make portions of the transparent substrate not etched and left under the wide light shielding portion and the narrow light shielding portion into a wide convex pattern and a narrow convex pattern respectively;
- a step of removing the narrow mask portion;
- a step of removing the wide resist portion; and
- a step of etching the light shielding pattern while using the wide mask portion as a mask, to reduce an area of the wide light shielding portion and to remove the narrow light shielding portion.

9. A reticle manufacturing method according to claim 8, wherein the step of retreating side surfaces of the mask pattern is executed by isotropically etching the mask pattern.

10. A reticle manufacturing method comprising:
- a step of forming a light shielding layer, a mask layer, a lift-off layer, and a resist in this order on a transparent substrate;
- a step of exposing and developing the resist to form a resist pattern having a wide resist portion and a narrow resist portion;
- a step of etching the lift-off layer while using the resist pattern as a mask, to form a lift-off pattern having a wide pattern portion and a narrow pattern portion under the wide resist portion and the narrow resist portion respectively;
- a step of etching the mask layer while using the lift-off pattern as a mask, to form a mask pattern having a wide mask portion and a narrow mask portion under the wide pattern portion and the narrow pattern portion respectively;
- a step of retreating side surfaces of the lift-off pattern, to reduce an area of the wide pattern portion and to remove the narrow pattern portion and thus lift off the resist pattern;
- a step of etching the light shielding layer while using the mask pattern as a mask, to form a light shielding pattern having a wide light shielding portion and a narrow light shielding portion under the wide mask portion and the narrow mask portion respectively;
- a step of etching the transparent substrate while using the light shielding pattern as a mask, to reduce a thickness of a portion of the transparent substrate not covered with the light shielding pattern and to make portions of the transparent substrate not etched and left under the wide light shielding portion and the narrow light shielding portion into a wide convex pattern and a narrow convex pattern respectively;
- a step of etching the mask pattern while using the wide pattern portion in the lift-off pattern as a mask after the lift-off, to reduce an area of the wide mask portion and to remove the narrow mask portion; and a step of etching the light shielding pattern while using the wide mask portion as a mask after the area of the wide mask portion is reduced, to reduce an area of the wide light shielding portion and to remove the narrow light shielding portion.

11. A reticle manufacturing method according to claim 10, wherein the step of retreating side surfaces of the lift-off pattern is executed by isotropically etching the lift-off pattern.

12. A reticle manufacturing method according to any one of claims 6, 8, and 10, wherein any one of a silicon nitride layer, a silicon dioxide layer, a silicon oxide nitride layer, a silicon carbide layer, a silicon oxycarbide layer, an amorphous silicon layer, and a silicon oxide fluoride layer is formed as at least one of the lift-off layer and the mask layer.

13. A reticle manufacturing method according to any one of claims 1, 6, 8, and 10, wherein a metal layer or a metallic material layer, which is formed of material different from the light shielding layer, is formed as the lift-off layer.

14. A reticle manufacturing method according to claim 13, wherein any one of an aluminum layer, a magnesium layer, an indium layer, and a tin layer is formed as the metal layer, and any one of a chromium alloy layer, a chromium oxide layer, a chromium nitride layer, an aluminum alloy layer, a magnesium alloy layer, an indium alloy layer, an indium oxide layer, a tin alloy layer, a tin oxide layer, and an indium-tin oxide layer is formed as the metallic material layer.

15. A reticle manufacturing method comprising:

a step of forming a light shielding layer, a lift-off layer, and a resist in this order on a transparent substrate;

a step of exposing and developing the resist to form a resist pattern having a wide resist portion and a narrow resist portion;

a step of etching the lift-off layer while using the resist pattern as a mask, to form a lift-off pattern having a wide pattern portion and a narrow pattern portion under the wide resist portion and the narrow resist portion respectively;

a step of etching the light shielding layer while using the lift-off pattern as a mask, to form a light shielding pattern having a wide light shielding portion and a narrow light shielding portion under the wide pattern portion and the narrow pattern portion respectively;

a step of etching the transparent substrate while using the light shielding pattern as a mask, to reduce a thickness of a portion of the transparent substrate not covered with the light shielding pattern and to make portions of the transparent substrate not etched and left under the wide light shielding portion and a narrow light shielding portion into a wide convex pattern and a narrow convex pattern respectively;

a step of retreating side surfaces of the lift-off pattern, to reduce an area of the wide pattern portion and to remove the narrow pattern portion and thus lift off the narrow resist portion on the narrow pattern portion;

a step of removing the wide resist portion; and a step of etching the light shielding pattern while using the wide pattern portion as a mask after the lift off, to reduce an area of the wide light shielding portion and to remove the narrow light shielding portion.

16. A reticle manufacturing method according to claim 15, wherein the step of retreating side surfaces of the lift-off pattern is executed by isotropically etching the lift-off pattern.

17. A reticle manufacturing method according to claim 15, wherein either any one of a silicon dioxide layer, a silicon oxide nitride layer, a silicon carbide layer, a silicon oxycarbide layer, an amorphous silicon layer, and a silicon oxide fluoride layer or a metal layer or a metallic material layer, which is formed of material different from the light shielding layer, is formed as the lift-off layer.

18. A reticle manufacturing method according to any one of claims 1, 6, 8, 10 and 15, wherein an etching depth of the transparent substrate in the step of forming the wide convex pattern and the narrow convex pattern is set to a depth at which a phase difference between exposure lights passed through the narrow convex pattern and a thin portion, whose thickness is reduced by the etching, of the transparent substrate respectively becomes $\pi$.

19. A reticle manufacturing method according to any one of claims 1, 6, 8, 10 and 15, wherein a chromium layer is formed as the light shielding layer.

* * * * *